(12) United States Patent
Ogata et al.

(10) Patent No.: US 12,237,411 B2
(45) Date of Patent: Feb. 25, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takahiro Ogata, Himeji Hyogo (JP); Teruyuki Ohashi, Kawasaki Kanagawa (JP); Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 534 days.

(21) Appl. No.: 17/691,015

(22) Filed: Mar. 9, 2022

(65) Prior Publication Data

US 2023/0090271 A1 Mar. 23, 2023

(30) Foreign Application Priority Data

Sep. 22, 2021 (JP) ................................. 2021-154763

(51) Int. Cl.
*H01L 29/16* (2006.01)
*H01L 27/088* (2006.01)
*H01L 29/78* (2006.01)

(52) U.S. Cl.
CPC ........ *H01L 29/7811* (2013.01); *H01L 27/088* (2013.01); *H01L 29/1608* (2013.01); *H01L 29/7804* (2013.01); *H01L 29/7806* (2013.01)

(58) Field of Classification Search
CPC ............... H01L 29/7811; H01L 27/088; H01L 29/1608; H01L 29/7804; H01L 29/7806; H01L 29/41775; H01L 29/0615; H01L 29/0696; H01L 27/0727

See application file for complete search history.

(56) References Cited

U.S. PATENT DOCUMENTS

| 9,831,316 | B2 | 11/2017 | Inoue et al. |
| 2015/0349051 | A1 | 12/2015 | Uchida et al. |
| 2017/0236935 | A1 | 8/2017 | Ebihara et al. |
| 2019/0371935 | A1 | 12/2019 | Hatta et al. |

(Continued)

FOREIGN PATENT DOCUMENTS

| JP | 2016-006854 A | 1/2016 |
| JP | 6138284 B2 | 5/2017 |

(Continued)

*Primary Examiner* — Elias Ullah
(74) *Attorney, Agent, or Firm* — Knobbe, Martens, Olson & Bear, LLP

(57) ABSTRACT

A semiconductor device of embodiments includes: an element region including a transistor, a first diode, and a first contact portion; a termination region surrounding the element region and including a second contact portion; and an intermediate region provided between the element region and the termination region and not including the transistor, the first diode, the first contact portion, and the second contact portion. The element region includes a first electrode, a second electrode, a gate electrode, a silicon carbide layer, and a gate insulating layer. The termination region includes a first wiring layer electrically connected to the first electrode, the second electrode, and the silicon carbide layer. The intermediate region includes the silicon carbide layer. The width of the intermediate region in a direction from the element region to the termination region is equal to or more than twice the thickness of the silicon carbide layer.

12 Claims, 17 Drawing Sheets

(56) References Cited

U.S. PATENT DOCUMENTS

| | | | |
|---|---|---|---|
| 2020/0127098 A1 | 4/2020 | Yamashiro et al. | |
| 2020/0185517 A1 | 6/2020 | Nakao et al. | |
| 2021/0288188 A1 | 9/2021 | Ohashi et al. | |

FOREIGN PATENT DOCUMENTS

| | | |
|---|---|---|
| JP | 2019-110331 A | 7/2019 |
| JP | 6611960 B2 | 11/2019 |
| JP | 6641488 B2 | 2/2020 |
| JP | 2021-145024 A | 9/2021 |
| WO | WO 2016/052261 A1 | 4/2016 |
| WO | WO 2018/037701 A1 | 3/2018 |

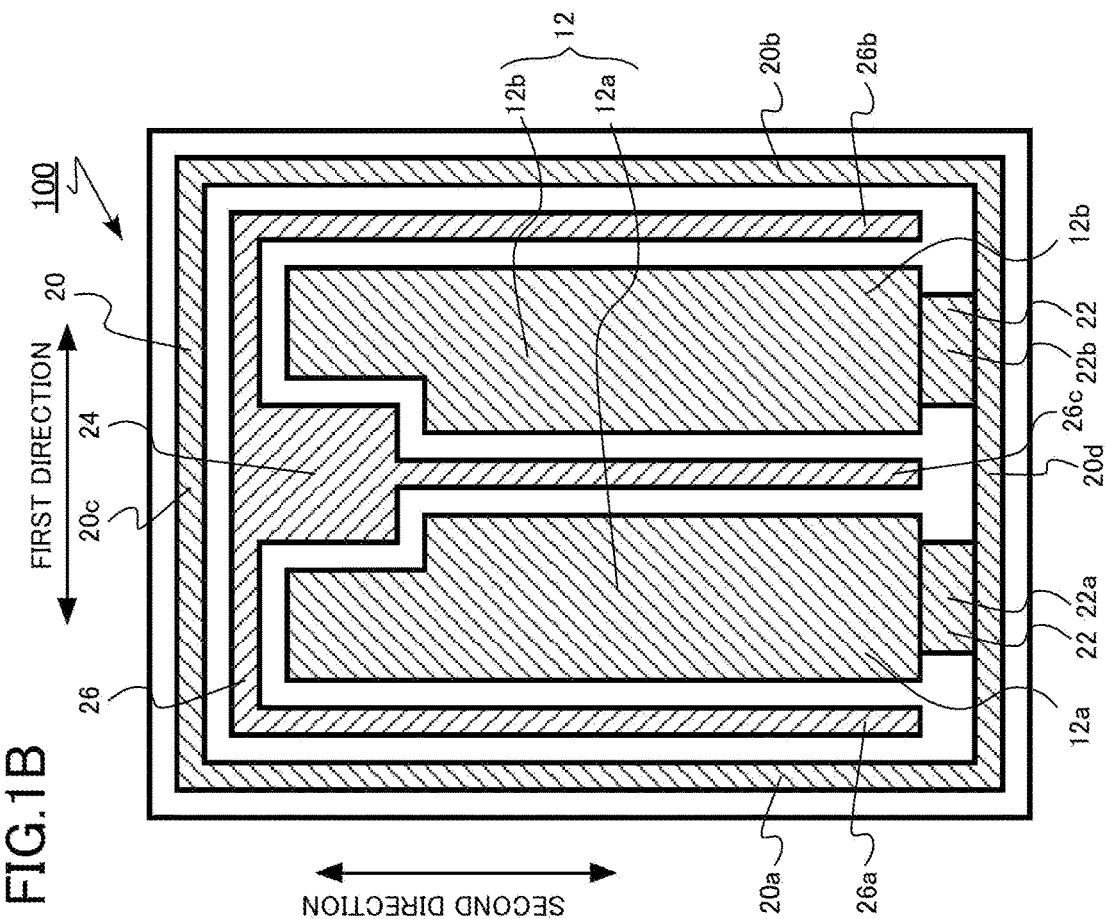
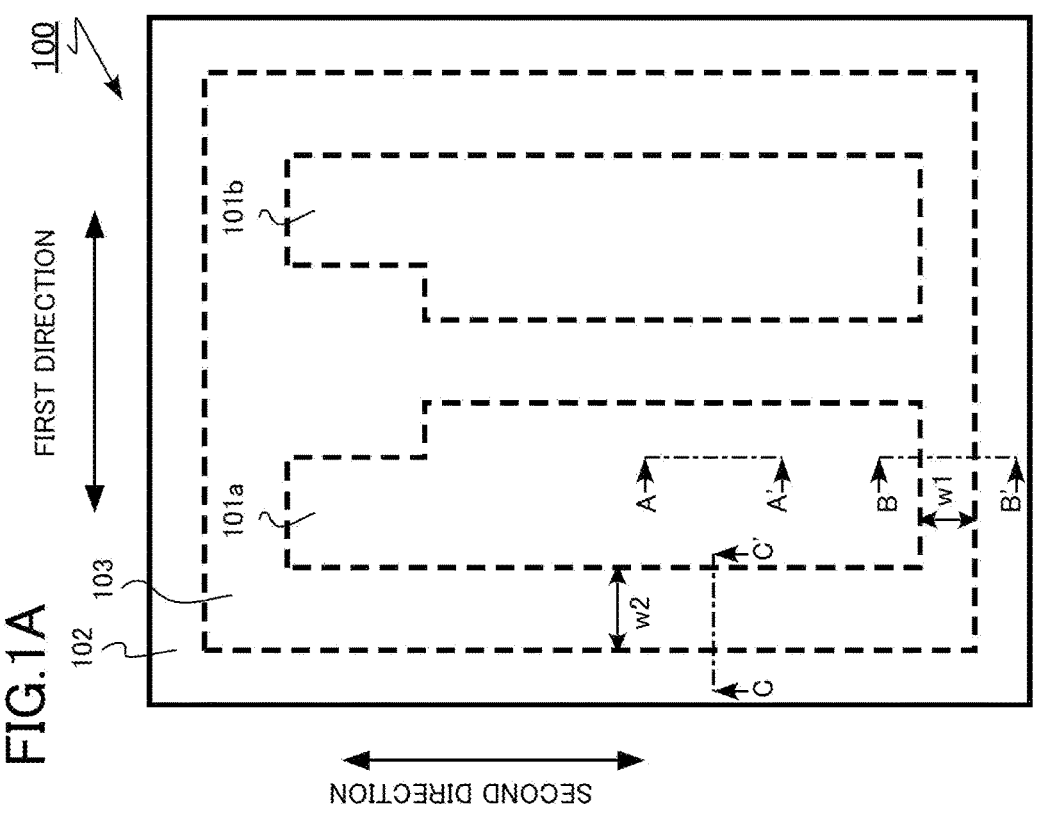

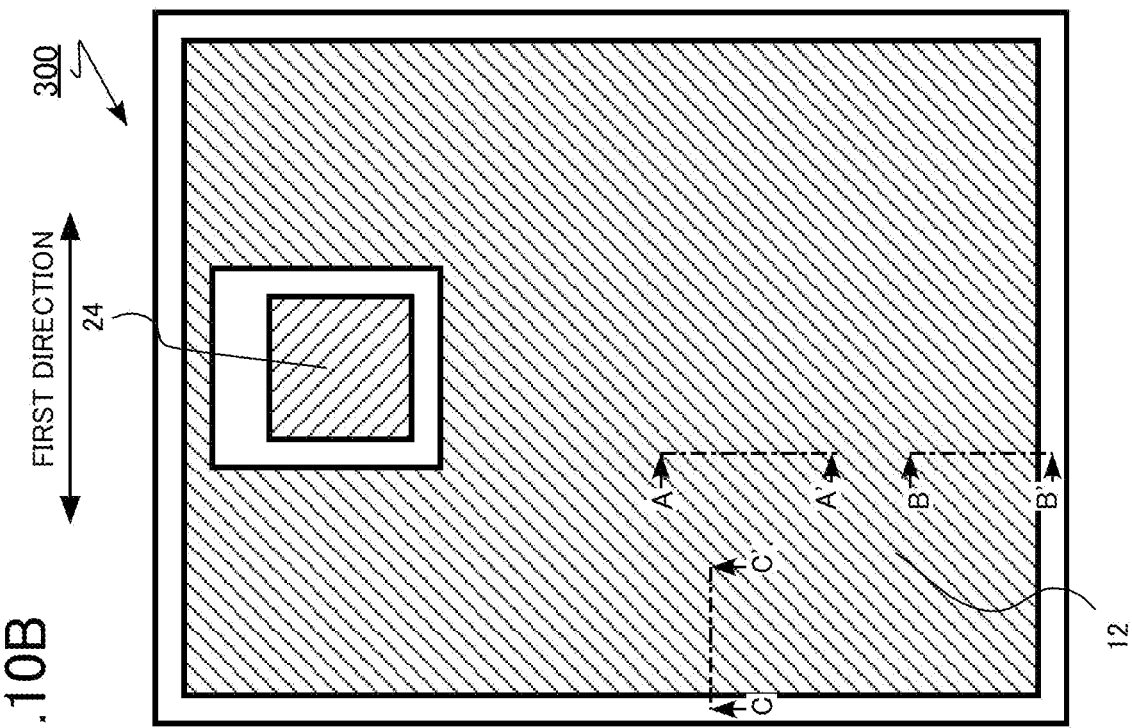
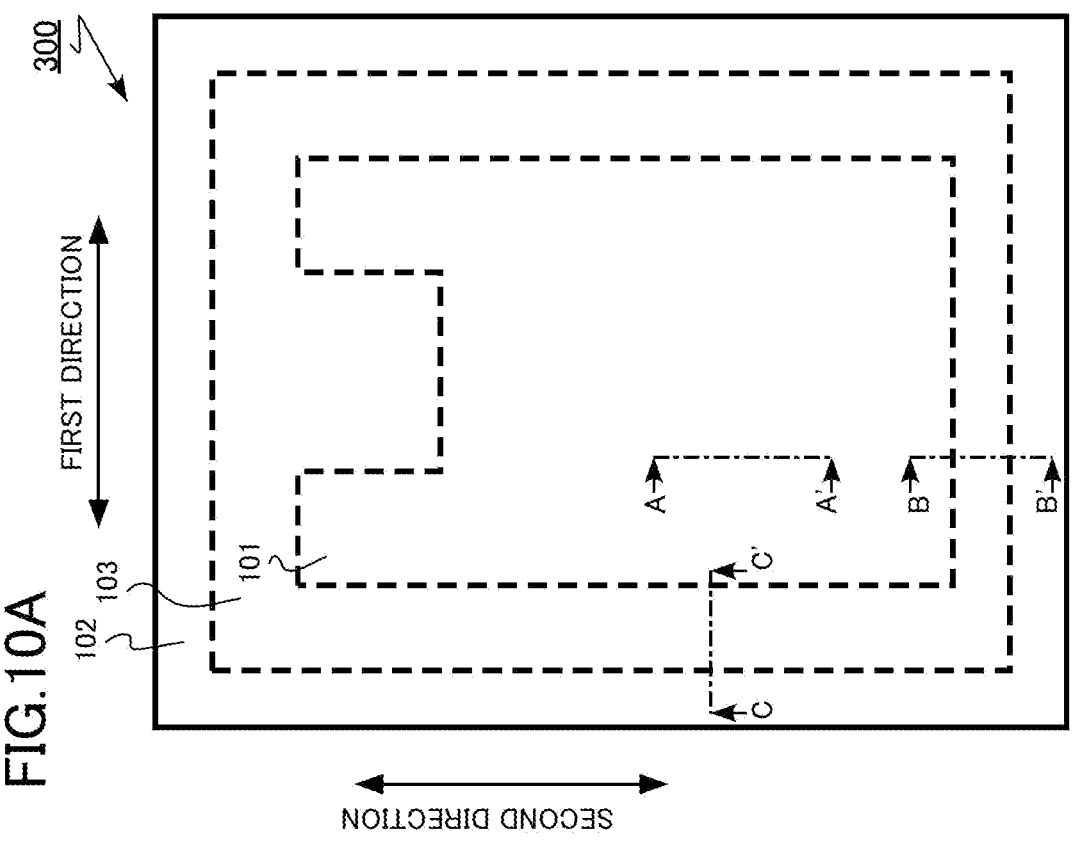

SEMICONDUCTOR DEVICE

CROSS-REFERENCE TO RELATED APPLICATION

This application is based upon and claims the benefit of priority from Japanese Patent Application No. 2021-154763, filed on Sep. 22, 2021, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such characteristics, for example, it is possible to realize a metal oxide semi-conductor field effect transistor MOSFET that has a high breakdown voltage and low loss and that can operate at high temperature.

A vertical MOSFET using silicon carbide has a pn junction diode as a built-in diode. For example, a MOSFET is used as a switching element connected to an inductive load. In this case, even when the MOSFET is in the off state, a reflux current can be made to flow by using a pn junction diode.

However, when a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET. For example, by providing a Schottky barrier diode (SED) operating in a unipolar manner in the MOSFET as a built-in diode, it is possible to suppress the growth of a stacking fault in the silicon carbide layer.

A high surge voltage may be applied to the MOSFET momentarily beyond the steady state. When a high surge voltage is applied, a large surge current flows to generate heat, destroying the MOSFET. The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

BRIEF DESCRIPTION OF THE DRAWINGS

FIGS. 1A and 1B are schematic top views of a semiconductor device of a first embodiment;

FIGS. 10A and 10B are schematic top views of a semiconductor device of a third embodiment;

DETAILED DESCRIPTION

Figure 2:
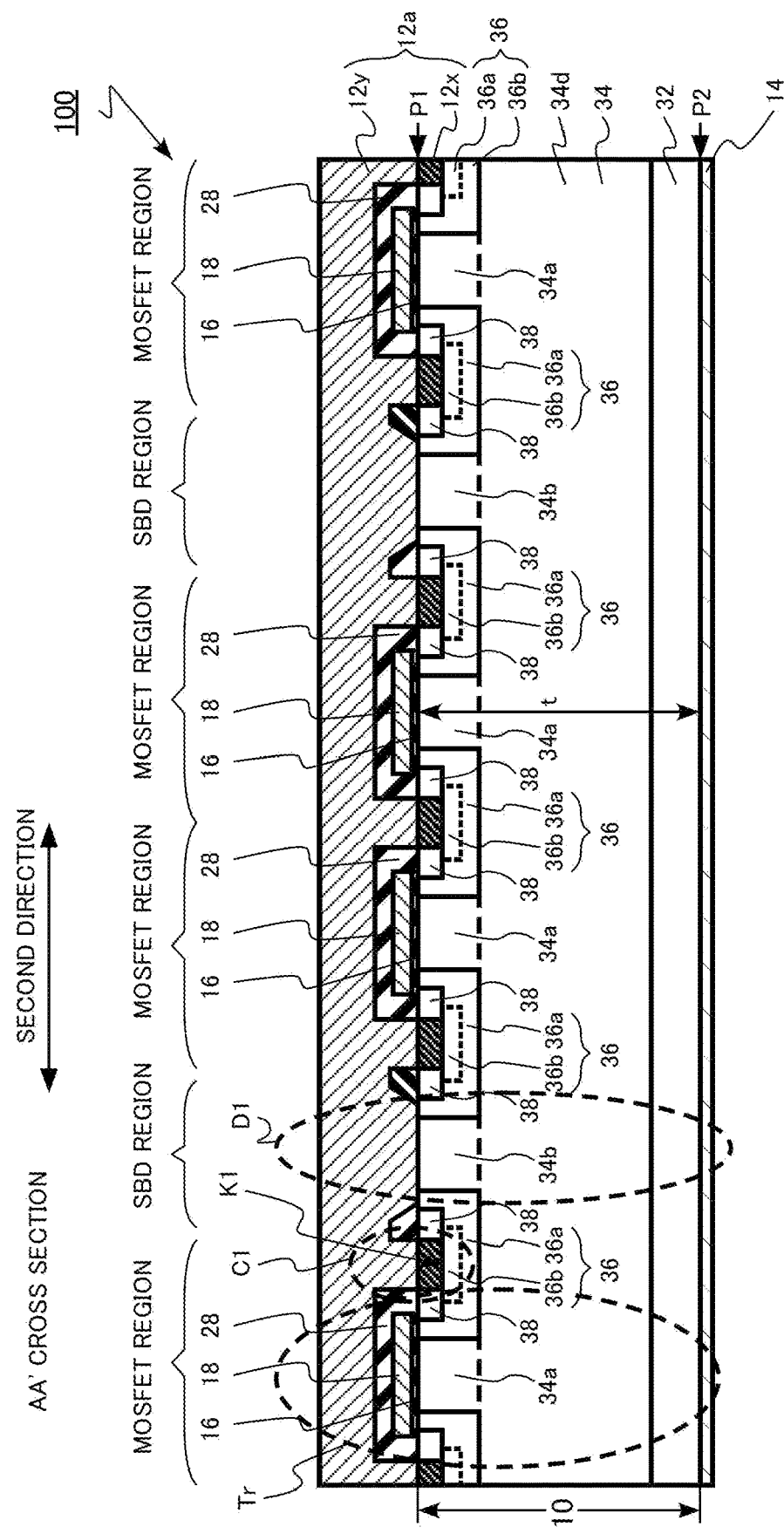
FIG. 2 is a schematic cross-sectional view of the semiconductor device of the first embodiment.

A semiconductor device of embodiments includes: an element region including a transistor, a first diode, and a first contact portion; a termination region surrounding the element region and including a second contact portion; and an intermediate region provided between the element region and the termination region and not including the transistor, the first diode, the first contact portion, and the second contact portion. The element region includes: a first electrode; a second electrode; a gate electrode; a silicon carbide layer provided between the first electrode and the second electrode, having a first face on a side of the first electrode and a second face on a side of the second electrode, and including: a first silicon carbide region of a first conductive type having a first region and a second region, the first region being in contact with the first face and facing the gate electrode, and the second region being in contact with the first face and in contact with the first electrode; a second silicon carbide region of a second conductive type provided between the first silicon carbide region and the first face, the second silicon carbide region being adjacent to the first region, the second silicon carbide region facing the gate electrode, and the second silicon carbide region being in contact with the first electrode at a first interface; and a third silicon carbide region of a first conductive type provided between the second silicon carbide region and the first face and electrically connected to the first electrode; and a gate insulating layer provided between the gate electrode and the second silicon carbide region and between the gate electrode and the first region, the termination region includes: a first wiring layer electrically connected to the first electrode; the second electrode; and the silicon carbide layer including the first silicon carbide region and a fourth silicon carbide region of a second conductive type, the fourth silicon carbide region provided between the first silicon carbide region and the first face, the fourth silicon carbide region being in contact with the first wiring layer at a second interface, the intermediate region includes the silicon carbide layer including the first silicon carbide region and a fifth silicon carbide region of a second conductive type, the fifth silicon carbide region provided between the first silicon carbide region and the first face, the transistor includes the gate electrode, the gate insulating layer, the first region, the second silicon carbide region, and the third silicon carbide region, the first diode includes the first electrode and the second region, the first contact portion includes the first interface, the second contact portion includes the second interface, and a width of the intermediate region in a direction from the element region to the termination region is equal to or more than twice a thickness of the silicon carbide layer.

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of n$^+$, n, n$^-$, p$^+$, p, and p$^-$, these notations indicate the relative high and low of the impurity concentration in each conductive type. That n$^+$ indicates that the n-type impurity concentration as relatively higher than n, and n$^-$ indicates that the n-type impurity concentration is relatively lower than n. In addition, p$^+$ indicates that the p-type impurity concentration is relatively higher than p, and p$^-$ indicates that the p-type impurity concentration is relatively lower than p. In addition, n$^+$-type and n$^-$-type may be simply described as n-type, p$^+$-type and p$^-$-type may be simply described as p-type.

In addition, unless otherwise specified in this specification, the "impurity concentration" means a concentration when the impurity concentration of the opposite conductive type is compensated for. That is, the n-type impurity concentration in an n-type silicon carbide region means a concentration obtained by subtracting the concentration of p-type impurities from the concentration of n-type impurities. In addition, the p-type impurity concentration in a p-type silicon carbide region means a concentration obtained by subtracting the concentration of n-type impurities from the concentration of p-type impurities.

In addition, unless otherwise specified in this specification, the "impurity concentration in the silicon carbide region" is a maximum impurity concentration in the corresponding silicon carbide region.

The impurity concentration can be measured by, for example, time of flight-secondary ion Mass spectrometry (TOF-SIMS). In addition, the relative high and low of the impurity concentration can be determined from, for example, the high and low of the carrier concentration obtained by scanning capacitance microscopy (SCM). In addition, the distance such as the depth and thickness of an impurity region can be calculated by, for example, the TOF-SIMS in addition, the distance such as the depth, thickness, and width of an impurity region and a spacing between impurity regions can be calculated from, for example, a composite image of an SCM image and an atomic force microscope (AFM) image.

First Embodiment

A semiconductor device of a first, embodiment includes: an element region including a transistor, a first diode, and a first contact portion; a termination region surrounding the element region and including a second contact portion; and an intermediate region provided between the element region and the termination region and not including the transistor, the first diode, the first contact portion, and the second contact portion. The element region includes: a first electrode; a second electrode; a gate electrode; a silicon carbide layer provided between the first electrode and the second electrode, having a first face on a side of the first electrode and a second face on a side of the second electrode, and including: a first silicon carbide region of a first conductive type having a first region in contact with the first face and facing the gate electrode and a second region in contact with the first face and in contact with the first electrode; a second silicon carbide region of a second conductive type provided between the first silicon carbide region and the first face, adjacent to the first region, facing the gate electrode, and in contact with the first electrode at a first interface; and a third silicon carbide region of a first conductive type provided between the second silicon carbide region and the first face and electrically connected to the first electrode; and a gate insulating layer provided between the gate electrode and the second silicon carbide region, between the gate electrode and the first region, and between the gate electrode and the third silicon carbide region. The termination region includes: a first wiring layer electrically connected to the first electrode; the second electrode; and the silicon carbide layer including the first silicon carbide region and a fourth silicon carbide region of a second conductive type provided between the first silicon carbide region and the first face and in contact with the first wiring layer at a second interface. The intermediate region includes the silicon carbide layer including the first silicon carbide region and a fifth silicon carbide region or a second conductive type provided between the first silicon carbide region and the first face. The transistor includes the gate electrode, the gate insulating layer, the first region, the second silicon carbide region, and the third silicon carbide region. The first diode includes the first electrode and the second region. The first contact portion includes the first interface. The second contact portion includes the second interface. A width of the intermediate region in a direction from the element region to the termination region is equal to or more than twice a thickness of the silicon carbide layer.

FIGS. 1A and 1B are schematic top views of the semiconductor device of the first embodiment. FIG. 1A shows a layout pattern of an element region, a termination region, and an intermediate region. FIG. 1B shows a layout pattern of a first electrode, a first wiring layer, a connection layer, a gate pad electrode, and a second wiring layer.

FIG. 2 is a schematic cross-sectional view of the semiconductor device of the first embodiment. FIG. 2 is a cross-sectional view taken along the line AA' of FIG. 1A.

Figure 3:
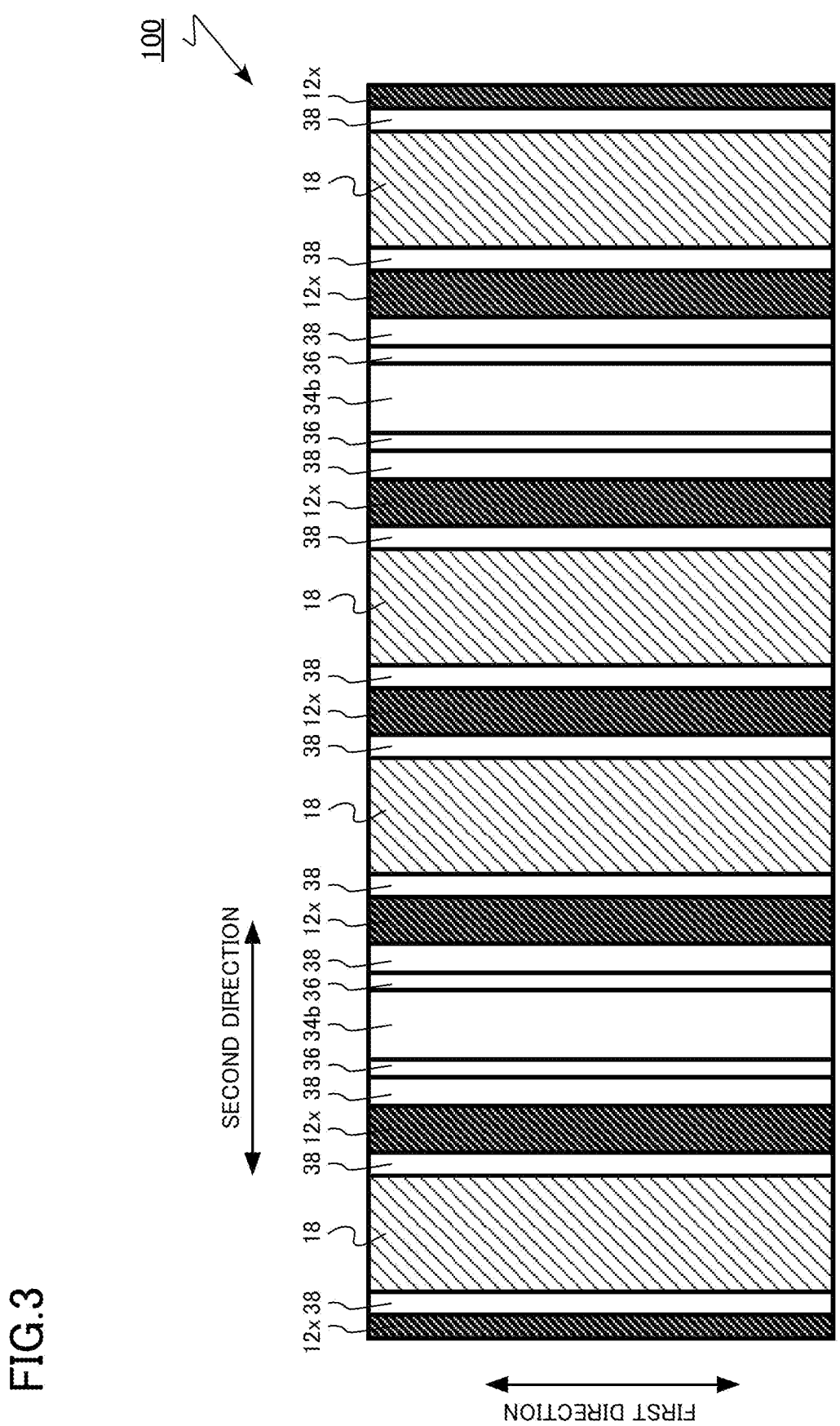
FIG. 3 is a schematic top view of the semiconductor device of the first, embodiment.

FIG. 3 is a schematic top view of the semiconductor device of the first embodiment. FIG. 3 is a top view corresponding to FIG. 2. FIG. 3 shows a layout pattern on the side of a first face of a semiconductor layer. FIG. 3 shows a state in which a first electrode and an interlayer insulating layer are removed.

Figure 4:
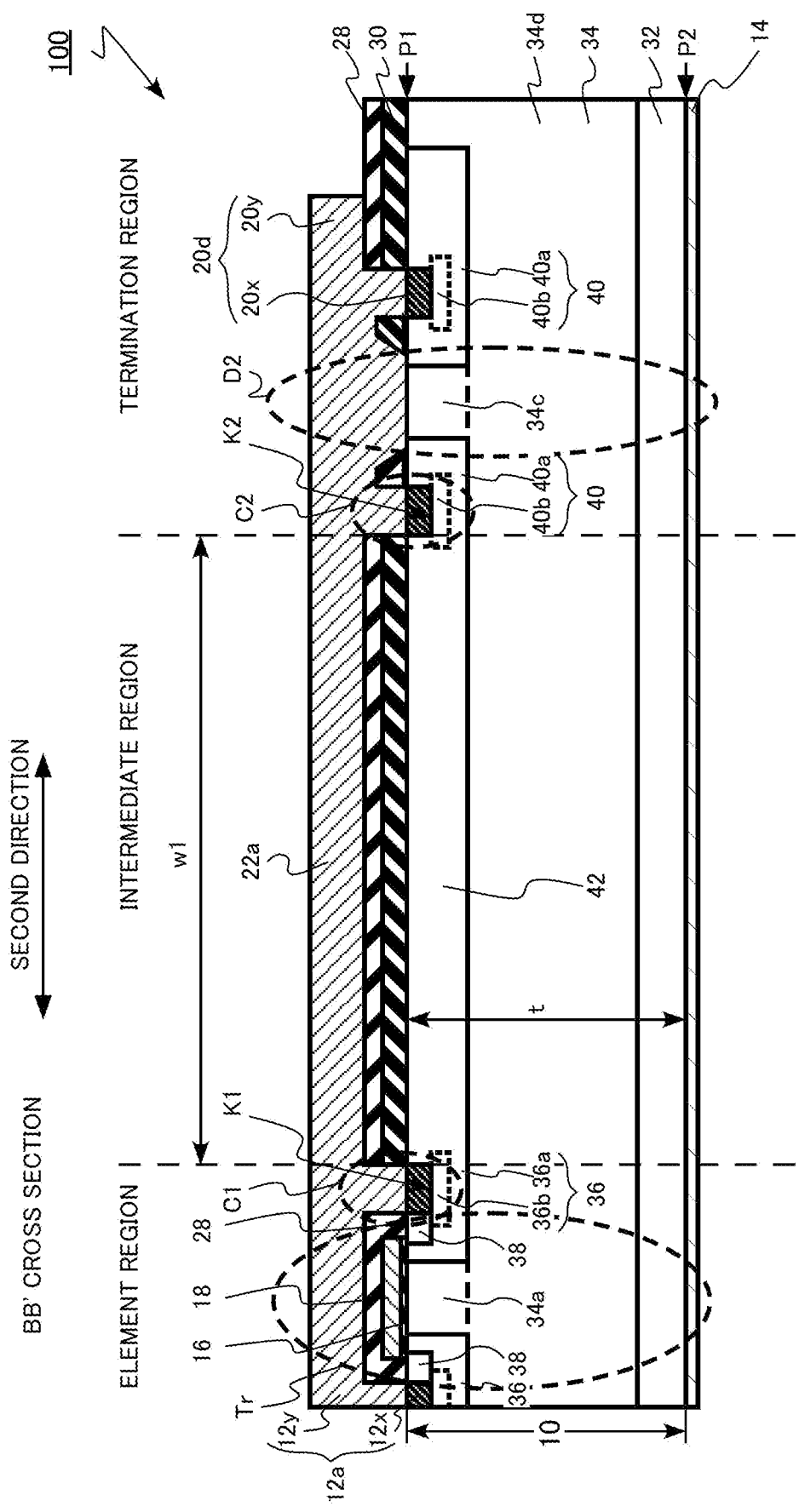
FIG. 4 is a schematic cross-sectional view of the semiconductor device of the first embodiment.

FIG. 4 is a schematic cross-sectional view of the semiconductor device of the first embodiment. FIG. 4 is a cross-sectional view taken along the line BB' of FIG. 1A.

Figure 5:
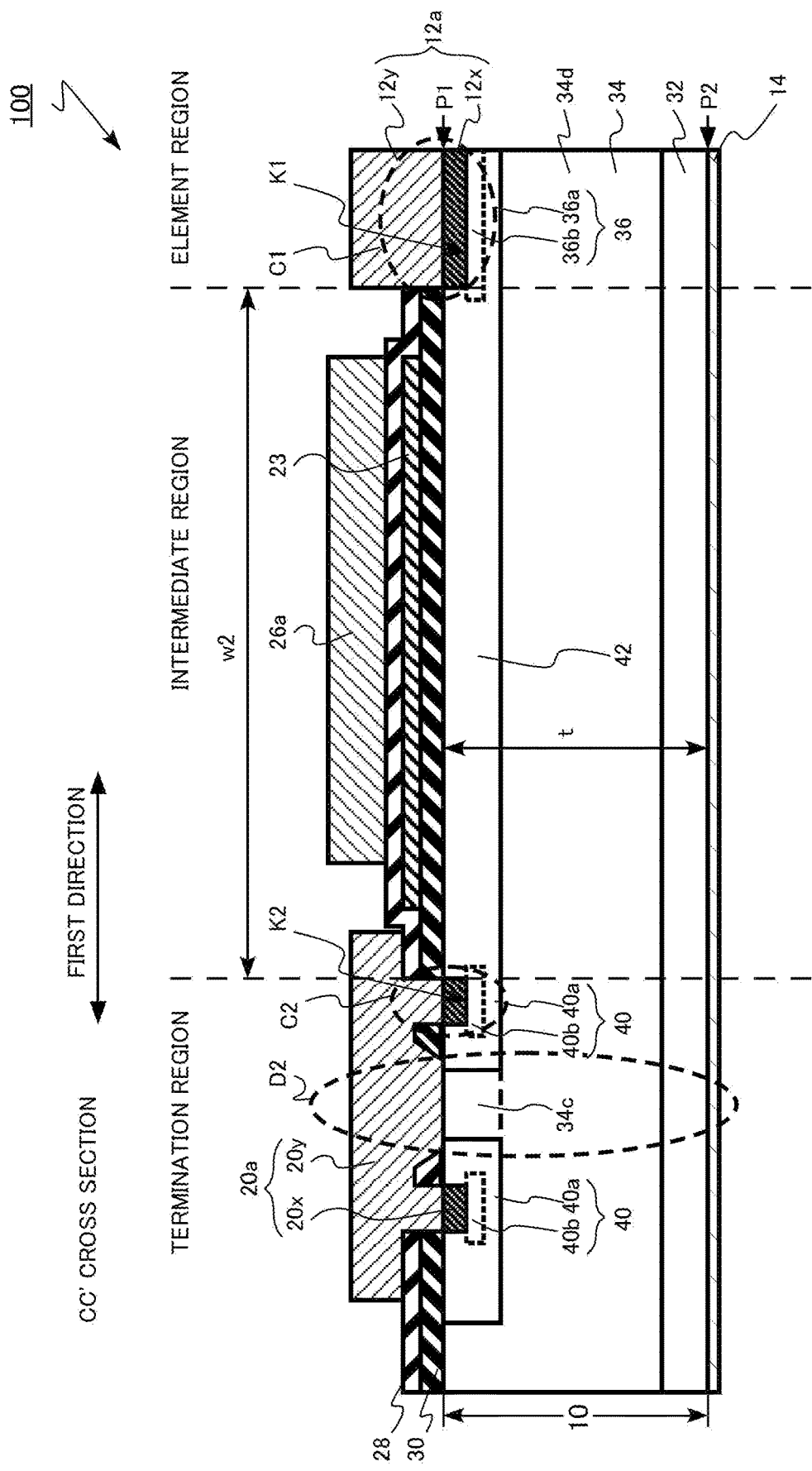
FIG. 5 is a schematic cross-sectional view of the semiconductor device of the first embodiment.

FIG. 5 is a schematic cross-sectional view of the semiconductor device of the first embodiment. FIG. 5 is a cross-sectional view taken along the line CC' of FIG. 1A.

The semiconductor device of the first embodiment is a planar gate type vertical MOSFET 100 using silicon carbide. The MOSFET 100 is, for example, a double implantation MOSFET (DIMOSFET) in which a body region and a source region are formed by ion implantation. In addition, the semiconductor device of the first embodiment includes an SBD as a built-in diode.

Hereinafter, a case where the first conductive type is n-type and the second conductive type is p-type will be described as an example. The MOSFET 100 is a vertical n-channel MOSFET having electrons as carriers.

The MOSFET 100 includes a first element region 101a (element region), a second element region 101b, a termination region 102, and an intermediate region 103. The first element region 101a is an example of the element region. Hereinafter, the first element region 101a and the second element region 101b may be collectively referred to as an element region 101.

The element region 101 includes a plurality of MOSFET regions and a plurality of SBD regions. The MOSFET region includes a transistor Tr. The SBD region includes a first diode D1. The element region 101 includes a first contact portion C1. The termination region 102 includes a second contact portion 52 and a second diode D2.

The MOSFET 100 includes a silicon carbide layer 10, a first source electrode 12a (first electrode), a second source electrode 12b, a drain electrode 14 (second electrode), a gate insulating layer 16, a gate electrode 18, a source wiring layer 20 (first wiring layer), a first connection layer 22a (connection layer), a second connection layer 22b, a gate connection line 23, a gate electrode pad 24, a gate wiring layer 26 (second wiring layer), an interlayer insulating layer 28, and a field insulating layer 30. The source wiring layer 20 has a first portion 20a, a second portion 20b, a third portion 20c, and a fourth portion 20d. The gate wiring layer 26 has a first line 26a, a second line 26b, and a Third line 26c.

The first source electrode 12a is an example of the first electrode. The drain electrode 14 is an example of the second electrode. The source wiring layer 20 is an example of the first wiring layer. The first connection layer 22a is an example of the connection layer. The gate wiring layer 26 is an example of the second wiring layer.

In the following description, the first source electrode 12a and the second source electrode 12b may be collectively referred to as the source electrode 12. In addition, the first connection layer 22a and the second connection layer 22b may be collectively referred to as a connection layer 22.

The silicon carbide layer 10 includes an n$^+$-type drain region 32, an n$^+$-type drift region 34 (first silicon carbide region), a p-type body region 36 (second silicon carbide region), an n$^+$-type source region 38 (third silicon carbide region), a p-type resurf region 40 (fourth silicon carbide region), and a p-type connection region 42 (fifth silicon carbide region). The drift region 34 has a JFET region 34a (first region), a first JBS region 34b (second region), a second JBS region 34c (third region), and a lower region 34d. The body region 36 has a low-concentration body region 36a and a high-concentration body region 36b. The resurf region 40 has a low-concentration resurf region 40a and a high-concentration resurf region 40b.

The drift region 34 is an example of the first silicon carbide region. The body region 36 is an example of the second silicon carbide region. The JFET region 34a is an example of the first region. The first JBS region 34b is an example of the second region. The second JBS region 34c is an example of a third region. The source region 38 is an example of the third silicon carbide region. The resurf region 40 is an example of the fourth silicon carbide region. The connection region 42 is an example of the fifth silicon carbide region.

As shown in FIG. 2, the element region 101 includes a plurality of MOSFET regions and a plurality of SBD regions. The MOSFET region includes the transistor Tr. The SBD region includes the first diode D1. The element region 101 includes the first contact portion C1. As shown in FIG. 1A, the element region 101 is divided into the first element region 101a and the second element region 101b, for example.

The MOSFET region extends in the first direction. The MOSFET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 100, the ratio between the number of MOSFET regions and the number of FED regions is 2:1.

The ratio between the number of MOSFET regions and the number of SET regions is not limited to 2:1. For example, the ratio between the number of MOSFET regions and the number of SBD regions may be 1:1 or 3:1 or any other ratio.

As shown in FIGS. 1B and 2, the element region 101 includes the silicon carbide layer 10, the first source electrode 12a (first electrode), the second source electrode 12b, the drain electrode 14 (second electrode), the gate insulating layer 16, the gate electrode 18, and the interlayer insulating layer 28.

The silicon carbide layer 10 in the element region 101 is provided between the source electrode 12 and the drain electrode 14. The silicon carbide layer 10 is a single crystal SiC. The silicon carbide layer 10 is, for example, 4H-SiC.

The silicon carbide layer 10 includes a first face ("P1" in FIG. 2) and a second face ("P2" in FIG. 2). Hereinafter, the first face P1 may be referred to as a surface, and the second face P2 may be referred to as a back surface. The first face P1 is disposed on the source electrode 12 side of the silicon carbide layer 10. In addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

The thickness (t in FIG. 2) of the silicon carbide layer 10 is equal to or more than 5 μm and equal to or less than 150 μm, for example.

As shown in FIG. 2, the silicon carbide layer 10 in the element region 101 includes the n$^+$-type drain region 32, the n$^-$-type drift, region 34 (first silicon carbide region), the p-type body region 36 (second silicon carbide region), and the n$^+$-type source region 38 (third silicon carbide region). The drift region 34 has the JFET region 34a (first region), the first JBS region 34b (second region), and the lower region 34d. The body region 36 has the low-concentration body region 36a and the high-concentration body region 36b.

The n$^+$-type drain region 32 is provided on the back surface side of the silicon carbide layer 10. The drain region 32 contains, for example, nitrogen (N) as an n-type impurity. The n-type impurity concentration in the drain region 32 is equal to or more than $1 \times 10^{18}$ cm$^{-3}$ and equal to or less than $1 \times 10^{21}$ cm$^{-3}$, for example.

The n⁻-type drift region 34 is provided between the drain region 32 and the first face P1. The n⁻-type drift region 34 is provided between the source electrode 12 and the drain electrode 14. The n⁻-type drift region 34 is provided between the gate electrode 18 and the drain electrode 14.

The n⁻-type drift region 34 is provided on the drain region 32. The drift region 34 contains, for example, nitrogen (N) as an n-type impurity. The n-type impurity concentration in the drift region 34 is lower than the n-type impurity concentration in the drain region 32. The n-type impurity concentration in the drift region 34 is equal to or more than $4 \times 10^{14}$ cm⁻³ and equal to or less than $1 \times 10^{17}$ cm⁻³, for example. The thickness of the drift region 34 is equal to or more than 5 µm and equal to or less than 150 µm, for example.

The n⁻-type drift region 34 has the JFET region. 34a, the first JBS region 34b, and the lower region 34d.

The JFET region 34a is provided between the lower region 34d and the first face P1. The JFET region 34a is in contact with the first face P1. The JFET region 34a is provided between two adjacent body regions 36.

The JFET region 34a extends in the first direction. The JFET region 34a faces the gate electrode 18 with the gate insulating layer 16 interposed therebetween.

The JFET region 34a functions as a current path for the MOSFET 100. The n-type impurity concentration in the JFET region 34a is higher than, for example, the n-type impurity concentration in the lower region 34d. The n-type impurity concentration in the JFET region 34a is equal to or more than $5 \times 10^{16}$ cm⁻³ and equal to or less than $2 \times 10^{17}$ cm⁻³, for example.

The first JBS region 34b is provided between the lower region 34d and the first face P1. The first JBS region 34b is in contact with the first face P1. The first JBS region 34b is provided between two adjacent body regions 36.

The first JBS region 34b extends in the first direction. The first JBS region 34b is in contact with the source electrode 12.

The first diode D1 is an SBD. The n-type impurity concentration in the first JBS region 34b is higher than, for example, the n-type impurity concentration in the lower region 34d. The n-type impurity concentration in the first JBS region 34b is equal to or more than $5 \times 10^{16}$ cm⁻³ and equal to or less than $2 \times 10^{17}$ cm⁻³, for example.

The p-type body region 36 is provided between the drift region 34 and a first face P1. The body region 36 extends in the first direction. The body region 36 functions as a channel region of the MOSFET 100. The body region 36 functions as a channel region of the transistor Tr.

The depth of the body region 36 is equal to or more than 0.5 µm and equal to or less than 1.0 µm, for example.

The body region 36 is electrically connected to the source electrode 12. The body region 36 is fixed to the electric potential of the source electrode 12.

A part of the body region 36 is in contact with the first face P1. A part of the body region 36 faces the gate electrode 18. A part of the body region 36 becomes a channel region of the MOSFET 100. The gate insulating layer 16 is interposed between a part of the body region 36 and the gate electrode 18.

The body region 36 is adjacent to the JFET region 34a. The body region 36 is in contact with the JFET region 34a.

The body region 36 has the low-concentration body region 36a and the high-concentration body region 36b. The high-concentration body region 36b is provided between the low-concentration body region 36a and the source electrode 12. The high-concentration body region 36b is in contact with the source electrode 12.

The body region 36 contains, for example, aluminum (Al) as a p-type impurity. The p-type impurity concentration in the low-concentration body region 36a is lower than the p-type impurity concentration in the high-concentration body region 36b. The p-type impurity concentration in the low-concentration body region 36a is equal to or more than $5 \times 10^{17}$ cm⁻³ and equal to or less than $5 \times 10^{19}$ cm⁻³, for example. The p-type impurity concentration in the high-concentration body region 36b is equal to or more than $1 \times 10^{19}$ cm⁻³ and equal to or less than $1 \times 10^{21}$ cm⁻³, for example.

The body region 36 is electrically connected to the source electrode 12. The body region 36 is electrically connected to the source electrode 12 by the first contact portion C1. The contact between the body region 36 and the source electrode 12 is, for example, an ohmic contact. The body region 36 is fixed to the electric potential of the source electrode 12.

The n⁺-type source region 38 is provided between the body region 36 and the first face P1. The source region 38 extends in the first direction.

The source region 38 contains, for example, phosphorus (P) or nitrogen (N) as an n-type impurity. The n-type impurity concentration in the source region 38 is higher than the n-type impurity concentration in the drift region 34.

The n-type impurity concentration in the source region 38 is equal to or more than $1 \times 10^{19}$ cm⁻³ and equal to or less than $1 \times 10^{21}$ cm⁻³, for example. The depth of the source region 38 is smaller than the depth of the body region 36. The depth of the source region 38 is equal to or more than 0.05 µm and equal to or less than 0.2 µm, for example.

The source region 38 is in contact with the source electrode 12. The source region 38 is electrically connected to the source electrode 12. The source region 38 is electrically connected to the source electrode 12 by the first contact portion C1. The contact between the source region. 38 and the source electrode 12 is, for example, an ohmic contact. The source region 38 is fixed to the electric potential of the source electrode 12.

The gate electrode 13 is provided on the first face P1 side of the silicon carbide layer 10. The gate electrode 13 extends in the first direction. A plurality of gate electrodes 18 are arranged in parallel with each other in the second direction. The gate electrode 18 has a striped shape.

The gate electrode 18 is a conductive layer. The gate electrode 18 is, for example, polycrystalline silicon containing p-type impurities or n-type impurities.

The gate electrode 18 faces the body region 36. The gate electrode 18 faces the JFET region 34a.

The gate insulating layer 16 is provided between the gate electrode 18 and the body region 36. The gate insulating layer 16 is provided between the gate electrode 18 and the JFET region 34a. The gate insulating layer 16 is provided between the gate electrode 18 and the source region 38.

The gate insulating layer 16 is, for example, silicon oxide. For example, a high-k insulating material (insulating material with a high dielectric constant) can be applied to the gate insulating layer 16.

The interlayer insulating layer 28 is provided on the gate electrode 18 and the silicon carbide layer 10. The interlayer insulating layer 28 is, for example, silicon oxide.

The source electrode 12 is in contact with the silicon carbide layer 10. The source electrode 12 is in contact with the source region 38. The source electrode 12 is in contact with the body region 36 at the first interface (K1 in FIG. 2).

The source electrode 12 is in contact with the high-concentration body region 36b at the first interface (K1 in FIG. 2). The source electrode 12 is in contact with the source region 38 at the first interface K1. The source electrode 12 is in contact with the first JIBS region 34b.

The source electrode 12 has, for example, a silicide layer 12x and a metal layer 12y. The silicide layer 12x is provided between the silicon carbide layer 10 and the metal layer 12y. The silicide layer 12x extends in the first direction.

The silicide layer 12x is in contact with the source region 38. The silicide layer 12x is in contact with the body region 36. The silicide layer 12x is in contact with the high-concentration body region 36b.

The source electrode 12 functions as an anode of the first diode D1.

The silicide layer 12x of the source electrode 12 contains silicide. The silicide layer 12x is, for example, nickel silicide or titanium silicide.

The contact between the source electrode 12 and the source region 38 becomes an ohmic contact by providing the silicide layer 12x. The contact between the source electrode 12 and the body region 36 becomes an ohmic contact by providing the silicide layer 12x. The contact between the source electrode 12 and the high-concentration body region 36b becomes an ohmic contact by providing the silicide layer 12x.

The metal layer 12y of the source electrode 12 contains metal. The metal layer 12y has, for example, a stacked structure of titanium (Ti) and aluminum (Al).

The drain electrode 14 is provided on the back surface of the silicon carbide layer 10. The drain electrode 14 is in contact with the drain region 32.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

As shown in FIG. 2, the transistor Tr includes the gate electrode 18, the gate insulating layer 16, the JFET region 34a, the body region 36, the source region 38, the source electrode 12, and the drain electrode 14. When the MOSFET 100 is in the ON state, a current flows from the drain electrode 14 to the source electrode 12 due to the transistor Tr.

As shown in FIG. 2, the first diode D1 includes the source electrode 12, the first JBS region 34b, and the drain electrode 14. When a forward bias is applied to the first diode D1, a current flows from the source electrode 12 to the drain electrode 14.

As shown in FIG. 2, the first contact portion C1 includes the source electrode 12, the first interface K1, and the body region 36. The first contact portion C1 includes the high-concentration body region 36b. The first contact portion C1 includes the source region 38.

The electric potential of the body region 36 is fixed to the electric potential of the source electrode 12 by the first on portion C1. By providing the first contact portion C1, the electric potential of the body region 36 is stabilized and the operation of the MOSFET 100 is stabilized.

The termination region 102 surrounds the element region 101, as shown in FIG. 1A. The termination region 102 includes the second contact portion C2 and the second diode D2. The termination region 102 has a function of increasing the dielectric breakdown voltage of the MOSFET 100 by reducing the strength of the electric field applied to the termination portion of the pn junction in the element region 101 when the MOSFET 100 is in the off state.

As shown in FIGS. 1B, 4 and 5, the termination region 102 includes the silicon carbide layer 10, the source wiring layer 20, the drain electrode 14 (second electrode), the interlayer insulating layer 23, and the field insulating layer 30.

The silicon carbide layer 10 in the termination region 102 is provided between the source wiring layer 20 and the drain electrode 14.

As shown in FIG. 4, the silicon carbide layer 10 in the termination region 102 includes the $n^+$-type drain region 32, the $n^-$-type drift region 34 (first silicon carbide region), and the p-type resurf region 40 (fourth silicon carbide region). The drift region 34 has the second TBS region 34c (third region) and the lower region 34d. The resurf region 40 has the low-concentration resurf region 40a and the high-concentration resurf region 40b.

The $n^+$-type drain region 32 is provided on the back surface side of the silicon carbide layer 10. The drain region 32 contains, for example, nitrogen (N) as an n-type impurity.

The $n^-$-type drift region 34 is provided between the drain region 32 and the first face P1. The $n^-$-type drift region 34 is provided between the source wiring layer 20 and the drain electrode 14.

The $n^-$-type drift region 34 is provided on the drain region 32. The drift region 34 contains, for example, nitrogen (N) as an n-type impurity.

The $n^-$-type drift region 34 has the second JBS region 34c and the lower region 34d.

The second JBS region 34c is provided between the lower region. 34d and the first face P1. The second JBS region 34c is in contact with the first face P1. The second JBS region 34c is provided between the two resurf regions 40 adjacent to each other. The second JBS region 34c is in contact with the source wiring layer 20.

The second diode D2 is an SBD. The n-type impurity concentration in the second JBS region 34c is higher than, for example, the n-type impurity concentration in the lower region 34d. The n-type impurity concentration in the second JBS region 34c is equal to or more than $5\times10^{16}$ cm$^{-3}$ and equal to or less than $2\times10^{17}$ cm$^{-3}$, for example.

The p-type resurf region 40 is provided between the drift region 34 and the first face P1. The depth of the resurf region 40 is equal to or more than 0.5 μm and equal to or less than 1.0 μm, for example.

The resurf region 40 is electrically connected to the source wiring layer 20. The resurf region 40 is electrically connected to the source wiring layer 20 by the first contact portion C1. The contact between the resurf region 40 and the source wiring layer 20 is, for example, an ohmic contact. The resurf region 40 is fixed to the electric potential of the source wiring layer 20.

The resurf region 40 has the low-concentration resurf region 40a and the high-concentration resurf region 40b. The high-concentration resurf region 40b is provided between the low-concentration resurf region 40a and the source wiring layer 20. The high-concentration resurf region 40b is in contact with the source wiring layer 20.

The resurf region 40 contains, for example, aluminum (Al) as a p-type impurity. The p-type impurity concentration in the low-concentration resurf region 40a is lower than the p-type impurity concentration in the high-concentration resurf region 40b. The p-type impurity concentration in the low-concentration resurf region 40a is equal to or more than $5\times10^{17}$ cm$^{-3}$ and equal to or less than $5\times10^{19}$ cm$^{-3}$, for example. The p-type impurity concentration in the high-concentration resurf region 40b is equal to or more than $1\times10^{19}$ cm$^{-3}$ and equal to or less than $1\times10^{21}$ cm$^{-3}$, for example.

The interlayer insulating layer 28 is provided on the field insulating layer 30. The interlayer insulating layer 23 is, for example, silicon oxide.

The field insulating layer 30 is provided on the silicon carbide layer 10. The field insulating layer 30 is, for example, silicon oxide.

As shown in FIG. 1B, the source wiring layer 20 surrounds the source electrode 12. The source wiring layer 20 is electrically connected to the source electrode 12.

The source wiring layer 20 has the first portion 20a, the second portion 20b, the third portion 20c, and the fourth portion 20d. The first portion 20a extends in the second direction. The second portion 20b extends in the second direction. The source electrode 12 is interposed between the first portion 20a and the second portion 20b. The third portion 20c extends in the first direction. The fourth portion 20d extends in the first direction. The source electrode 12 is interposed between the third portion 20c and the fourth portion 20d.

The source wiring layer 20 is in contact with the silicon carbide layer 10. The source wiring layer 20 is in contact with the resurf region 40 at the second interface (K2 in FIG. 4). The source wiring layer 20 is in contact with the high-concentration resurf region 40b at the second interface (K2 in FIG. 4).

The source wiring layer 20 has, for example, a silicide layer 20x and a metal layer 20y. The silicide layer 20x is provided between the silicon carbide layer 10 and the metal layer 20y.

The silicide layer 20x is in contact with the resurf region 10. The silicide layer 20x is in contact with the high-concentration resurf region 40b.

The source wiring layer 20 functions as an anode of the second diode D2.

The silicide layer 20x of the source wiring layer 20 contains silicide. The silicide layer 20x is, for example, nicked silicide or titanium silicide.

The contact between the source wiring layer 20 and the resurf region 40 becomes an ohmic contact by providing the silicide layer 20x. The contact between the source wiring layer 20 and the high concentration resurf region 40b becomes an ohmic contact by providing the silicide layer 20x.

The metal layer 20y of the source wiring layer 20 contains metal. The metal layer 20y has, for example, a stacked structure of titanium (Ti) and aluminum (Al).

The drain electrode 14 is provided on the back surface of the silicon carbide layer 10. The drain electrode 14 is in contact with the drain region 32.

As shown in FIGS. 4 and 5, the second diode D2 includes the source wiring layer 20, the second JBS, region 34c, and the drain electrode 14. When a forward bias is applied to the second diode D2, a current flows from the source wiring layer 20 to the drain electrode 14.

As shown in FIGS. 4 and 5, the second contact portion C2 includes the source wiring layer 20, the second interface K2, and the resurf region 40. The second contact portion C2 includes the high-concentration resurf region 40b.

The electric potential of the resurf region 40 is fixed to the electric potential of the source wiring layer 20 by the second contact portion C2. By providing the second contact portion C2, for example, the dielectric breakdown voltage of the MOSFET 100 is stabilized.

As shown in FIG. 1A, the intermediate region 103 is provided between the element region 101 and the termination region 102. The intermediate region 103 surrounds the element region 101. The termination region 102 surrounds the intermediate region 103.

The intermediate region 103 does not include the transistor Tr, the first diode D1, the second diode D2, the first contact portion C1, and the second contact portion C2.

As shown in FIGS. 1B, 4, and 5, the intermediate region 103 includes the silicon carbide layer 10, the first connection layer 22a (connection layer), the second connection layer 22b, the gate connection line 23, the gate electrode pad 24, the gate wiring layer 26, the drain electrode 14 (second electrode), the interlayer insulating layer 28, and the field insulating layer 30.

The silicon carbide layer 10 in the intermediate region 103 is provided between the connection layer 22 and the drain electrode 14, between the gate wiring layer 26 and the drain electrode 14, and between the gate electrode pad 24 and the drain electrode 14.

As shown in FIG. 4, the silicon carbide layer. 10 in the intermediate region 103 includes the n$^+$-type drain region 32, the n$^-$-type drift region 34 (first silicon carbide region), and the p-type connection region 42 (fifth silicon carbide region).

The n$^+$-type drain region 32 is provided on the back surface side of the silicon carbide layer 10. The drain region 32 contains, for example, nitrogen (N) as an n-type impurity.

The n$^-$-type drift region 34 is provided between the drain region 32 and the first face P1. The n$^-$-type drift region 34 is provided between the connection layer 22 and the drain electrode 14.

The n$^-$-type drift region 34 is provided on the drain region 32. The drift region 34 contains, for example, nitrogen (N) as an n-type impurity.

The n$^-$-type drift region 34 has the lower region. 34d.

The p-type connection region 42 is provided between the drift region 34 and the first face P1. The depth of the connection region 42 is equal to or more than 0.5 μm and equal to or less than 1.0 μm, for example.

The connection region 42 is provided between the body region 36 and the resurf region 40. The connection region 42 is in contact with, for example, the body region 36. The connection region 42 is in contact with, for example, the resurf region 40. The connection region 42, the body region 36, and the resurf region 40 are, for example, continuous. The connection region 42, the body region 36, and the resurf region 40 are simultaneously formed by using, for example, the same manufacturing process.

The connection region 42 is electrically connected to the source electrode 12 through the body region 36, for example. The connection region 42 is electrically connected to the source wiring layer 20 through the resurf region 40, for example.

The connection region 42 is fixed to, for example, the electric potential of the source electrode 12. The connection region 42 is fixed to, for example, the electric potential of the source wiring layer 20.

The connection region 42 contains, for example, aluminum (Al) as a p-type impurity. The p-type impurity concentration in the connection region 42 is equal to or more than $5\times10^{17}$ cm$^{-3}$ and equal to or less than $5\times10^{19}$ cm$^{-3}$, for example.

The interlayer insulating layer 28 is provided on the field insulating layer 30. The inter layer insulating layer 28 is, for example, silicon oxide.

The field insulating layer 30 is provided on the silicon carbide layer 10. The field insulating layer 30 is, for example, silicon oxide.

The connection layer 22 is provided on the first face P1 side of the silicon carbide layer 10. The connection layer 22 is provided between the source electrode 12 and the source wiring layer 20. The connection layer 22 is in contact with the source electrode 12. The connection layer 22, is in contact with the source wiring layer 20. The connection layer 22 is electrically connected to the source electrode 12 and the source wiring layer 20.

For example, the first connection layer 22a is provided between the first source electrode 12a and the fourth portion 20d of the source wiring layer 20. The first connection layer 22a is provided in the second direction of the first source electrode 12a.

For example, the second connection layer 22b is provided between the second source electrode 12b and the fourth portion 20d of the source wiring layer 20. The second connection layer 22b is provided in the second direction of the second source electrode 12b.

The connection layer 22 contains metal. The connection layer 22 has, for example, a stacked structure of titanium (Ti) and aluminum (Al).

The gate electrode pad 24 is provided on the first face P1 side of the silicon carbide layer 10. The gate electrode pad 24 contains metal. The gate electrode pad 24 has, for example, a stacked structure of titanium (Ti) and aluminum (Al).

The gate wiring layer 26 is provided on the first face P1 side of the silicon carbide layer 10. The gate wiring layer 26 is connected to the gate electrode pad 24. The gate wiring layer 26 is electrically connected to the gate electrode pad 24.

The gate wiring layer 26 has the first line 26a, the second line 26b, and the third line 25c. A part of the first line 26a extends in the second direction. A part of the second line 26b extends in the second direction. The third line 26c extends in the second direction.

The first line 26a is provided between the first portion 20a of the source wiring layer 20 and the first source electrode 12a. The second line 26b is provided between the second portion 20b of the source wiring layer 20 and the second source electrode 12b. The third lire 26c is provided between the first source electrode 12a and the second source electrode 12b.

The gate electrode 18 provided in the element region 101 is electrically connected to the gate electrode pad 24 through the gate connection line 23 and the gate wiring layer 26.

The gate wiring layer 26 contains metal. The gate wiring layer 26 has, for example, a stacked structure of titanium (Ti) and aluminum (Al).

For example, the source electrode 12, the source wiring layer 20, the connection layer 22, the gate electrode pad 21, and the gate wiring layer 26 contain the same material. For example, the source electrode 12, the source wiring layer 20, the connection layer 22, the gate electrode pad 24, and the gate wiring layer 26 contain titanium and aluminum. For example, the source electrode 12, the source wiring layer 20, the connection layer 22, the gate electrode pad 24, and the gate wiring layer 26 are simultaneously formed by using the same manufacturing process.

The drain electrode 14 is provided on the back surface of the silicon carbide layer 10. The drain electrode 14 is in contact with the drain region 32.

The width of the intermediate region 103 in the second direction from the element, region 101 to the termination region 102 is equal to or more than twice the thickness of the silicon carbide layer 10. The width of the intermediate region 103 is, for example, a distance between the first contact portion C1 and the second contact portion C2 in the second direction.

For example, the first width (w1 in FIG. 4) of the intermediate region 103 including the connection layer 22 in the second direction from the element region 101 to the termination region 102 is equal to or more than twice the thickness (t in FIG. 4) of the silicon carbide layer 10. In addition, for example, the second width (w2 in FIG. 5) of the intermediate region 103 including the first line 26a of the gate wiring layer 26 in the first direction from the element region 101 to the termination region 102 is equal to or more than twice the thickness (t in FIG. 5) of the silicon carbide layer 10.

For example, the first width w1 is larger than the second width w2. For example, the first width w1 is equal to or more than 1.2 times the second width w2.

Next, the function and effect of the MOSFET 100 of the first embodiment will be described.

Figure 6:
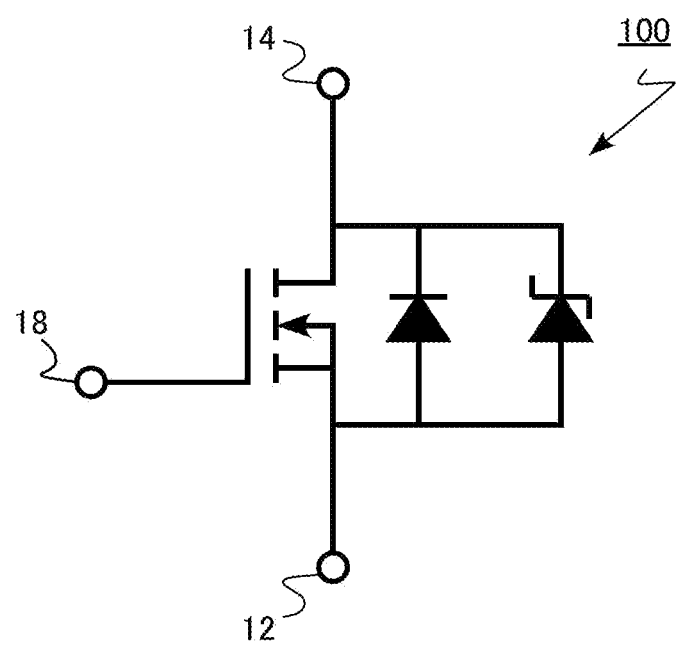
FIG. 6 is an equivalent circuit diagram of the semiconductor device of the first embodiment.

FIG. 6 is an equivalent circuit diagram of the semiconductor device of the embodiment. In the MOSFET 100, between the source electrode 12 and the drain electrode 14 in the element region 101, a pn junction diode and an SBD are connected as built-in diodes in parallel with a transistor. The body region 36 is on the anode side of the pn junction diode, and the drift region 34 is on the cathode side of the pn junction diode. In addition, the source electrode 12 is the anode of the SBD, and the drain electrode 14 is the cathode of the SBD.

For example, a case where the MOSFET 100 is used as a switching element connected to an inductive load is considered. When the MOSFET 100 is turned off, a voltage that is positive with respect to the drain electrode 14 may be applied to the source electrode 12 due to an induced current caused by an inductive load in this case, a forward current flows through the built-in diode. This state is also referred to as a reverse conduction state.

If the MOSFET does not include an SBD, a forward current flows through the pn junction diode. The pn junction diode operates in a bipolar manner. When a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET.

The MOSFET 100 includes an SBD. A forward voltage (Vf) at which a forward current starts to flow through the SBD is lower than a forward voltage (Vf) of the pn junction diode. Therefore, a forward current flows through the SBD prior to the pn junction diode.

The forward voltage (Vf) of the SBD is equal to or more than 1.0 V and less than 2.0 V, for example. The forward voltage (Vf) of the pn junction diode is equal to or more than 2.0 V and equal to or less than 3.0 V, for example.

The SBD operates in a unipolar manner. Therefore, even if a forward current flows, no stacking fault grows in the silicon carbide layer 10 due to the recombination energy of the carriers. Therefore, the increase in the on-resistance of the MOSFET 100 is suppressed. As a result, the reliability of the MOSFET 100 is improved.

A high surge voltage that momentarily makes the source electrode 12 positive may be applied between the source electrode 12 and the drain electrode 14 of the MOSFET 100.

When a high surge voltage is applied, a large surge current flows through the MOSFET 100, and the MOSFET 100 may be destroyed.

The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

When a surge voltage is applied to the MOSFET 100, a forward voltage is applied to the pn junction between the drift region 34 and the body region 36 in the element region 101. When the voltage applied to the pn junction exceeds the forward voltage (Vf) of the pn junction diode, hole injection from the first contact portion C1 into the drift region 34 starts. Holes are injected from the first contact portion C1 into the drift region 34 through the body region 36.

When hole injection from the first contact portion C1 into the drift region 34 starts, conductivity modulation occurs to reduce the resistance of the drift region 34. When the resistance of the drift region 34 is reduced, a large forward current flows between the source electrode 12 and the drain electrode 14. In other words, due to the bipolar operation of the pn junction diode, a large surge current flows between the source electrode 12 and the drain electrode 14.

Since the large surge current flows between the source electrode 12 and the drain electrode 14, the element region 101 generates heat. When thermal breakdown of the element region 101 occurs due to heat generation, the MOSFET 100 breaks down.

Figure 7:
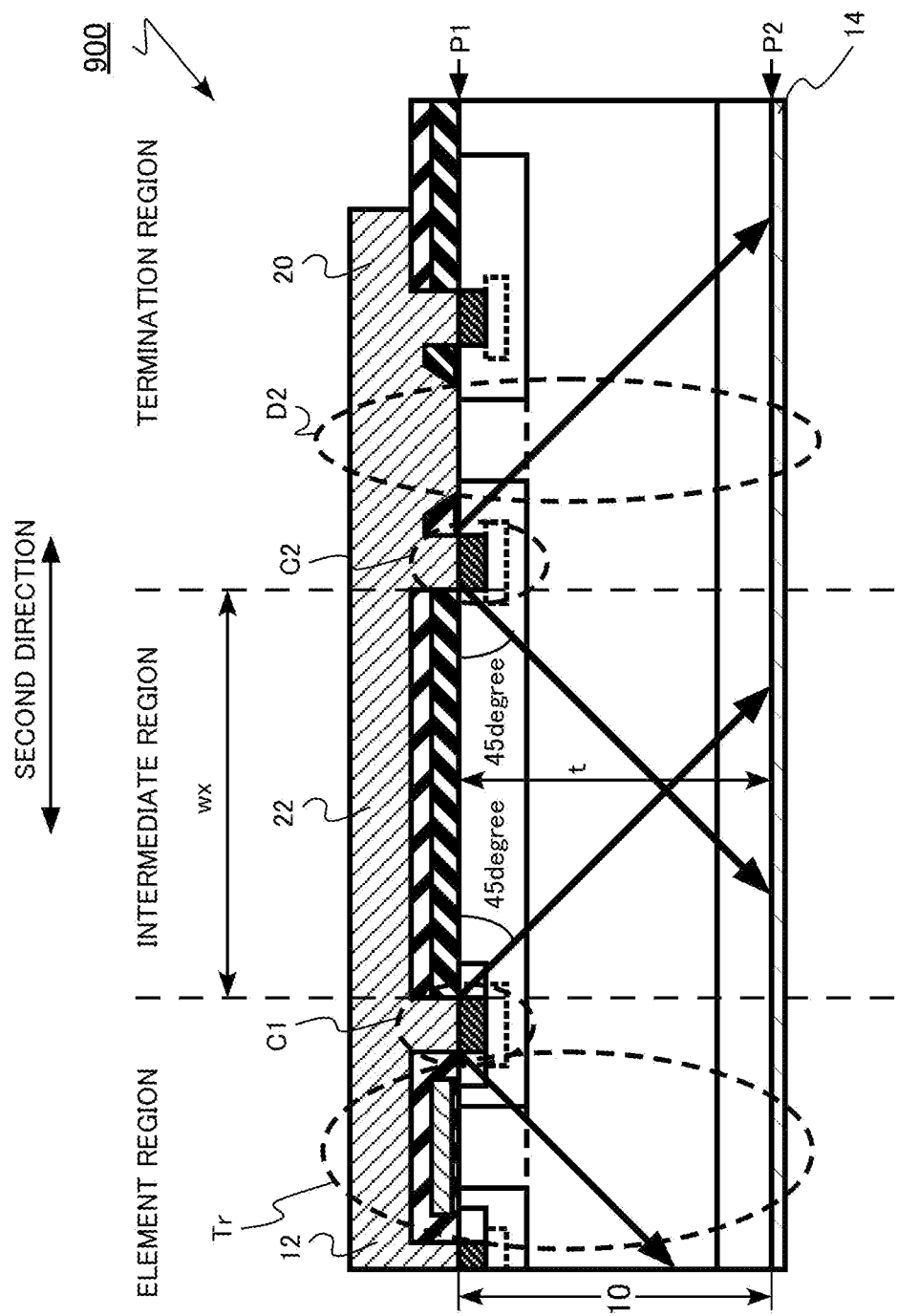
FIG. 7 is an explanatory diagram of the function and effect of the semiconductor device of the first embodiment.

FIG. 7 is an explanatory diagram of the function and effect of the semiconductor device of the first embodiment. FIG. 7 is a schematic cross-sectional view of a semiconductor device of a comparative example. The semiconductor device of the comparative example is a MOSFET 900. FIG. 7 is a diagram corresponding to FIG. 4 of the first embodiment.

The MOSFET 900 of the comparative example is different from the MOSFET 100 of the first embodiment in that the width (wx in FIG. 7) of the intermediate region 103 in a direction from the element region 101 to the termination region 102 is less than twice the thickness (t in FIG. 7) of the silicon carbide layer 10.

When a surge voltage is applied to the MOSFET 900 of the comparative example, thermal breakdown may occur not in the element region 101 but in the termination region 102. Since thermal breakdown occurs in the termination region 102, the maximum allowable peak current value of the MOSFET 900 is decreased to lower the surge current withstand capacity.

When a surge voltage is applied to the MOSFET 900 of the comparative example, a high voltage is applied between the source electrode 12 and the drain electrode 14 in the element region 101. On the other hand, in the termination region 102, a high voltage is applied between the source wiring layer 20 and the drain electrode 14.

When the surge voltage exceeds the forward voltage (Vf) of the pn junction diode in the element region 101, hole injection from the first contact portion C1 into the drift region 34 in the element region 101 starts addition, when the surge voltage exceeds the forward voltage (Vt) of the pn junction diode in the termination region 102, hole injection from the second contact portion C2 into the drift, region 34 in the termination region 102 starts.

Holes injected from the first contact portion C1 propagate through the drift region 34 as a diffusion current with an inclination of 45' with respect to the first face P1. In addition, similarly, holes injected from the second contact portion C2 propagate through the drift region 34 as a diffusion current with an inclination of 45° with respect to the first face P1.

When the width wx of the intermediate region 103 is less than twice the thickness t of the silicon carbide layer 10, the diffusion current flowing from the first contact portion C1 and the diffusion current flowing from the second contact portion C2 cross each other at the bottom of the silicon carbide layer 10. 2t, which is twice the thickness t of the silicon carbide layer 10, corresponds to 2t×tan 45°.

In a region where the diffusion current flowing from the first contact portion C1 and the diffusion current flowing from the second contact portion C2 cross each other, the conductivity modulation is promoted to further reduce the resistance of the drift region 34. When the resistance of the drift region 34 is reduced, the surge current flowing through the termination region 102 increases. Since the surge current flowing through the termination region 102 increases, it is considered that heat generation in the termination region 102 is promoted and accordingly thermal breakdown in the termination region 102 is likely to occur.

Figure 8:
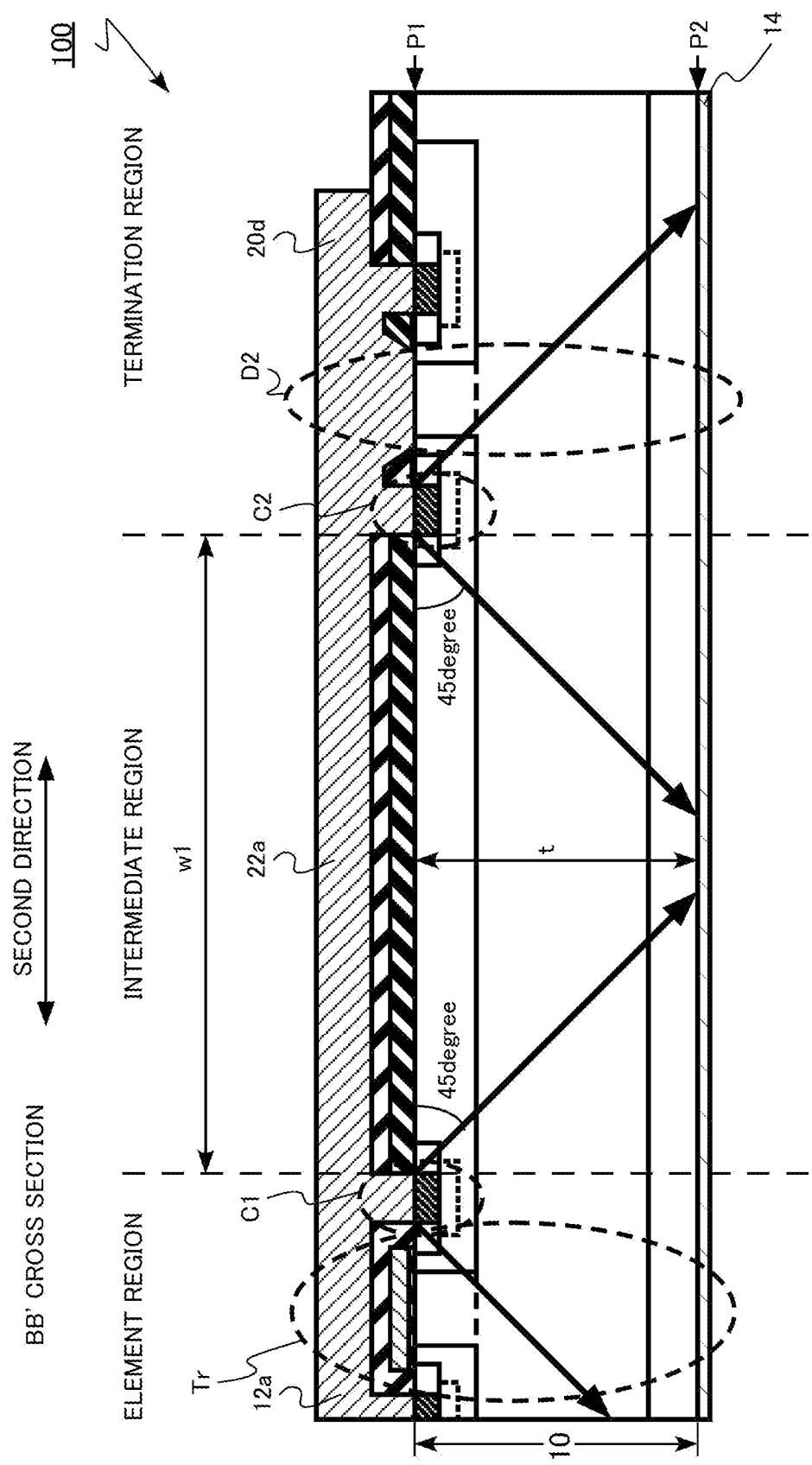
FIG. 8 is an explanatory diagram of the function and effect of the semiconductor device of the first embodiment.

FIG. 8 is an explanatory diagram of the function and effect of the semiconductor device of the first embodiment. FIG. 8 is a schematic cross-sectional view of the semiconductor device of the first embodiment. FIG. 8 is a diagram corresponding to FIG. 4.

In the MOSFET 100 of the first embodiment, the width of the intermediate region 103 in the second direction from the element region 101 to the termination region 102 is equal to or more than twice the thickness of the silicon carbide layer 10. For example, as shown in FIG. 8, the first width (w1 in FIG. 8) of the intermediate region 103 including the connection layer 22 in the second direction from the element region 101 to the termination region 102 is equal to or more than twice the thickness (t in FIG. 8) of the silicon carbide layer 10. In addition, for example, the second width (w2 in FIG. 5) of the intermediate region 103 including the first line 26a of the gate wiring layer 26 in the first direction from the element region 101 to the termination region 102 is equal to or more than twice the thickness (t in FIG. 5) of the silicon carbide layer 10.

Since the width of the intermediate region 103 is equal to or more than twice the thickness of the silicon carbide layer 10, the diffusion current flowing from the first contact portion C1 and the diffusion current flowing from the second contact portion C2 do not cross each other at the bottom of the silicon carbide layer 10. Since the diffusion currents do not cross each other at the bottom of the silicon carbide layer 10, the conductivity modulation is not promoted. The resistance of the drift region 34 is not further reduced, and the surge current flowing through the termination region 102 is suppressed. Therefore, heat generation in the termination region 102 is suppressed, and thermal breakdown in the termination region 102 is suppressed. As a result, the surge current withstand capacity of the MOSFET 100 is improved as compared with the MOSFET 900 of the comparative example.

From the viewpoint of improving the surge current withstand capacity of the MOSFET 100, the width of the intermediate region 103 in the second direction from the element region 101 to the termination region 102 is preferably equal to or more than 2.5 times, more preferably equal to or more than 3 times the thickness of the silicon carbide layer 10.

From the viewpoint of improving the surge current withstand capacity of the MOSFET 100, it is preferable that the first width (w1 in FIG. 4) of the intermediate region 103 in the second direction is larger than the second width (w2 in FIG. 5) of the intermediate region. 103 in the first direction. In other words, it is preferable that the first width w1 of the intermediate region 103 in a direction perpendicular to the first direction in which the gate electrode 18 extends is larger than the second width w2 of the intermediate region 103 in a direction parallel to the first direction in which the gate electrode 13 extends.

In the direction perpendicular to the first direction in which the gate electrode 18 extends, the first contact portion C1 along the gate electrode 18 closest to the intermediate region 103 faces the intermediate region 103. In the direction parallel to the first direction in which the gate electrode 18 extends, the first contact portion C1 at the end of the gate electrode 18 in the first direction faces the intermediate region 103. The first contact portion C1 at the end of the gate electrode 18 in the first direction is present only in a portion where the end of the gate electrode 18 in the first direction faces the intermediate region 103. In other words, in the direction parallel to the first direction in which the gate electrode 18 extends, the first contact portion C1 facing the intermediate region 103 is thinned out at the arrangement pitch of the gate electrode 18.

Therefore, in the direction perpendicular to the first direction in which the gate electrode 18 extends, the density of the first contact portion C1 facing the intermediate region 103 is higher than that in the direction parallel to the first direction in which the gate electrode 18 extends. Therefore, in the intermediate region 103 in the direction perpendicular to the first direction in which the gate electrode 18 extends, the diffusion current flowing from the first contact portion C1 becomes larger than that in the intermediate region 103 in the direction parallel to the from first direction in which the gate electrode 18 extends. As a result, in the direction perpendicular to the first direction in which the gate electrode 18 extends, the conductivity modulation is promoted and the heat generation in the termination region 102 is promoted as compared with the direction parallel to the first direction in which the gate electrode 18 extends.

Since the first width w1 of the intermediate region 103 in the direction perpendicular to the first direction in which the gate electrode 18 extends is set to be larger than the second width w2 of the intermediate region 103 in the direction parallel to the first direction in which the gate electrode 18 extends, heat generation in the termination region 102 is suppressed and thermal breakdown in the termination region 102 is suppressed in the direction perpendicular to the first direction in which the gate electrode 18 extends. As a result, the surge current withstand capacity of the MOSFET 100 is improved.

From the viewpoint of improving the surge current withstand capacity of the MOSFET 100, the first width (w1 in FIG. 4) of the intermediate region 103 in the second direction is preferably equal to or more than 1.2 times, more preferably equal to or more than 1.5 times the second width (w2 in FIG. 5) of the intermediate region 103 in the first direction.

As the width of the intermediate region 103 increases, the occupancy rate of the element region 101 of the MOSFET 100 decreases. As the occupancy rate of the element region 101 of the MOSFET 100 decreases, the on-current of the MOSFET 100 decreases.

From the viewpoint of increasing the on-current of the MOSFET 100, the width of the intermediate region 103 in the direction from the element region 101 to the termination region 102 is preferably equal to or less than 10 times, more preferably equal to or less than 5 times the thickness of the silicon carbide layer 10. For example, the second width (w2 in FIG. 5) of the intermediate region 103 including the first line 26a of the gate wiring layer 26 in the first direction from the element region 101 to the termination region. 102 is preferably equal to or less than 10 times, more preferably equal to or less than 5 times the thickness (t in FIG. 5) of the silicon carbide layer 10. In addition, for example, the first width (w1 in FIG. 4) of the intermediate region 103 including the connection layer 22 in the second direction from the element region 101 to the termination region. 102 is preferably equal to or less than 10 times, more preferably equal to or less than 5 times the thickness (t in FIG. 4) of the silicon carbide layer 10.

The termination region. 102 preferably includes the second diode D2. By providing the second diode D2 in the termination region 102, the starting voltage of hole injection from the second contact portion C2 into the drift region 34 rises. By increasing the starting voltage from the second contact portion C2 to the hole injection in the drift region 34, the conductivity modulation in the drift region 34 of the termination region 102 is suppressed. Therefore, heat generation in the termination region 102 is suppressed, and thermal breakdown in the termination region 102 is suppressed.

It is preferable that the source electrode 12, the source wiring layer 20, the connection layer 22, the gate electrode pad 24, and the gate wiring layer 26 contain the same material. The source electrode 12, the source wiring layer 20, the connection layer 22, the gate electrode pad 24, and the gate wiring layer 26 can be simultaneously formed by using the same manufacturing process. Therefore, the manufacturing cost of the MOSFET 100 can be reduced.

As described above, according to the first embodiment, a MOSFET in which thermal breakdown in the termination region is suppressed and the surge current withstand capacity is improved is realized.

Second Embodiment

A semiconductor device of a second embodiment is different from the semiconductor device of the first embodiment in that the termination region does not include a second diode. Hereinafter, the description of a part of the content overlapping the first embodiment may be omitted.

Figure 9:
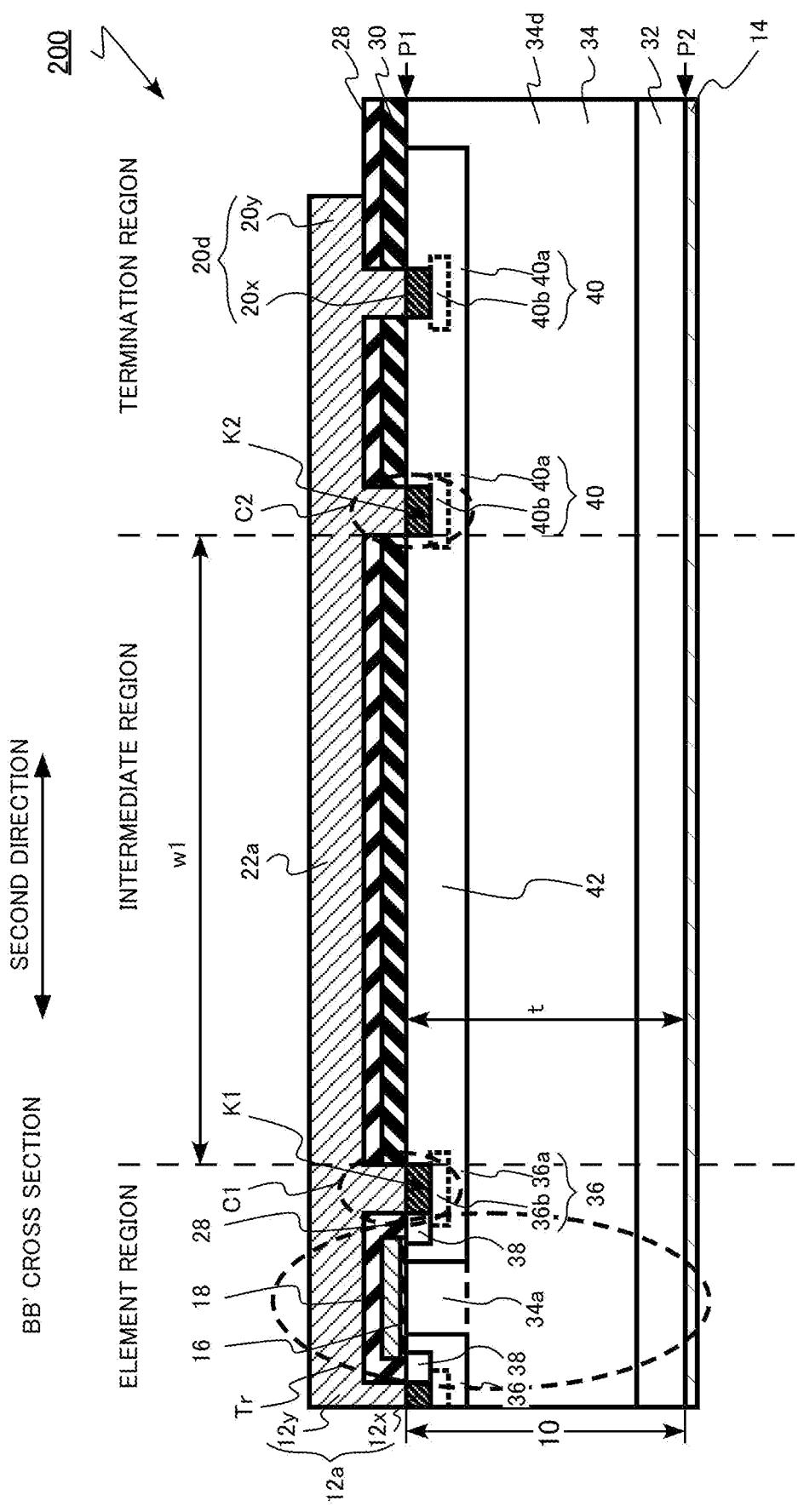
FIG. 9 is a schematic cross-sectional view of a semiconductor device of a second embodiment.

FIG. 9 is a schematic cross-sectional view of the semiconductor device of the second embodiment. FIG. 9 is a diagram corresponding to FIG. 4 of the first embodiment.

The semiconductor device of the second embodiment is a planar gate type vertical MOSFET 200 using silicon carbide. The MOSFET 200 of the second embodiment is, for example, a DIMOSFET in which a body region and a source region are formed by ion implantation. In addition, the semiconductor device of the second embodiment includes an STD as a built-in diode.

As shown in FIG. 9, the termination region 102 of the MOSFET 200 does not include a second diode.

As described above, according to the second embodiment, as in the first embodiment, a MOSFET in which thermal breakdown in the termination region is suppressed and the surge current withstand capacity is improved is realized.

Third Embodiment

A semiconductor device of a third embodiment includes: an element region including a transistor, a first diode, and a first contact portion; a termination region surrounding the element region and including a second contact portion; and an intermediate region provided between the element region and the termination region and not including the transistor, the first diode, the first contact portion, and the second contact portion. The element region includes: a first electrode; a second electrode; a gate electrode; a silicon carbide layer provided between the first electrode and the second electrode, having a first face on a side of the first electrode and a second face on a side of the second electrode, and including: a first silicon carbide region of a first conductive type having a first region in contact with the first face and facing the gate electrode and a second region in contact with the first face and in contact with the first electrode; a second silicon carbide region of a second conductive type provided between the first silicon carbide region and the first face, adjacent to the first region, facing the gate electrode, and in contact with the first electrode at a first interface; and third silicon carbide region of a first conductive type provided between the second silicon carbide region and the first face and electrically connected to the first electrode; and a gate insulating layer provided between the gate electrode and the second silicon carbide region and between the gate electrode and the first region. The termination region includes: the first electrode; the second electrode; and the silicon carbide layer including the first silicon carbide region and a fourth silicon carbide region of a second conductive type provided between the first silicon carbide region and the first face and in contact with the first electrode at a second interface. The intermediate region includes: the first electrode; the second electrode; and the silicon carbide layer including the first silicon carbide region and a fifth silicon carbide region of a second conductive type provided between the first silicon carbide region and the first face. The transistor includes the gate electrode, the gate insulating layer, the first region, the second silicon carbide region, and the third silicon carbide region. The first diode includes the first electrode and the second region. The first contact portion includes the first interface. The second contact portion includes the second interface. A width of the intermediate region in a direction from the element region to the termination region is equal to or more than twice a thickness of the silicon carbide layer.

FIGS. 10A and 10B are schematic top views of the semiconductor device of the third embodiment. FIG. 10A shows a layout pattern of an element region, a termination region, and an intermediate region. FIG. 10B shows a layout pattern of a first electrode and a gate pad electrode.

Figure 11B:
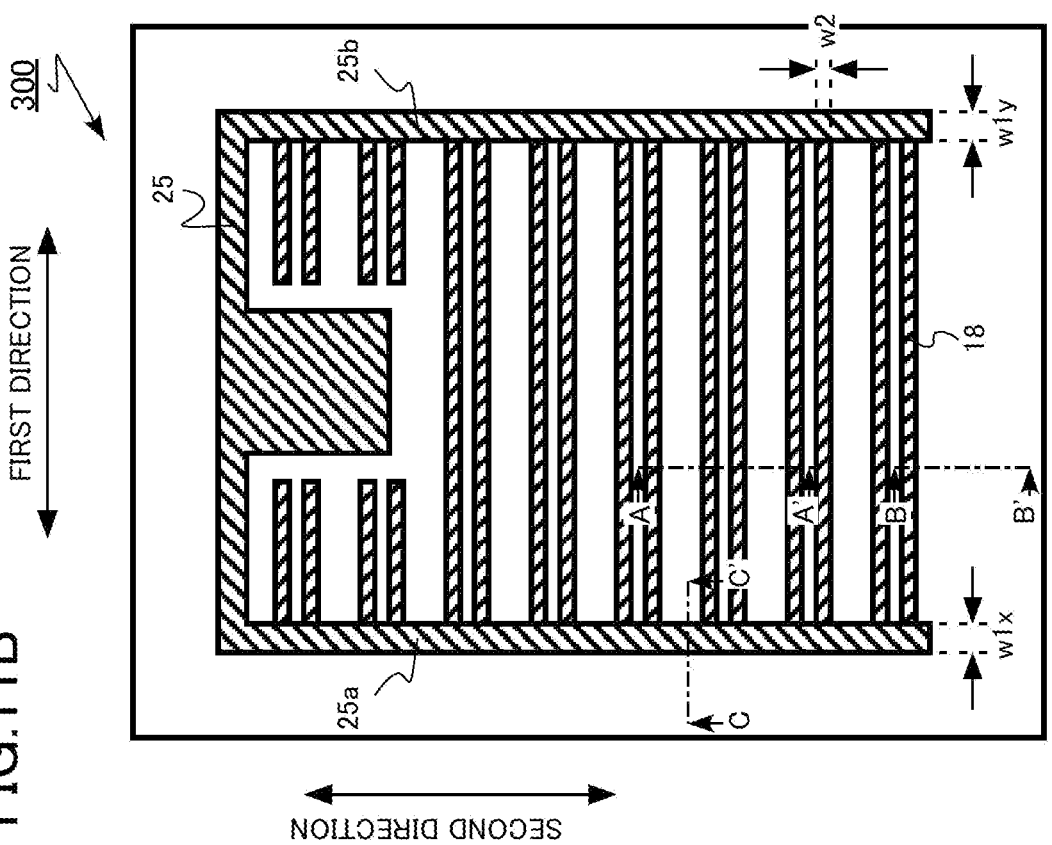
FIGS. 11A and 11B are schematic top views of the semiconductor device of the third embodiment.
Figure 11A:
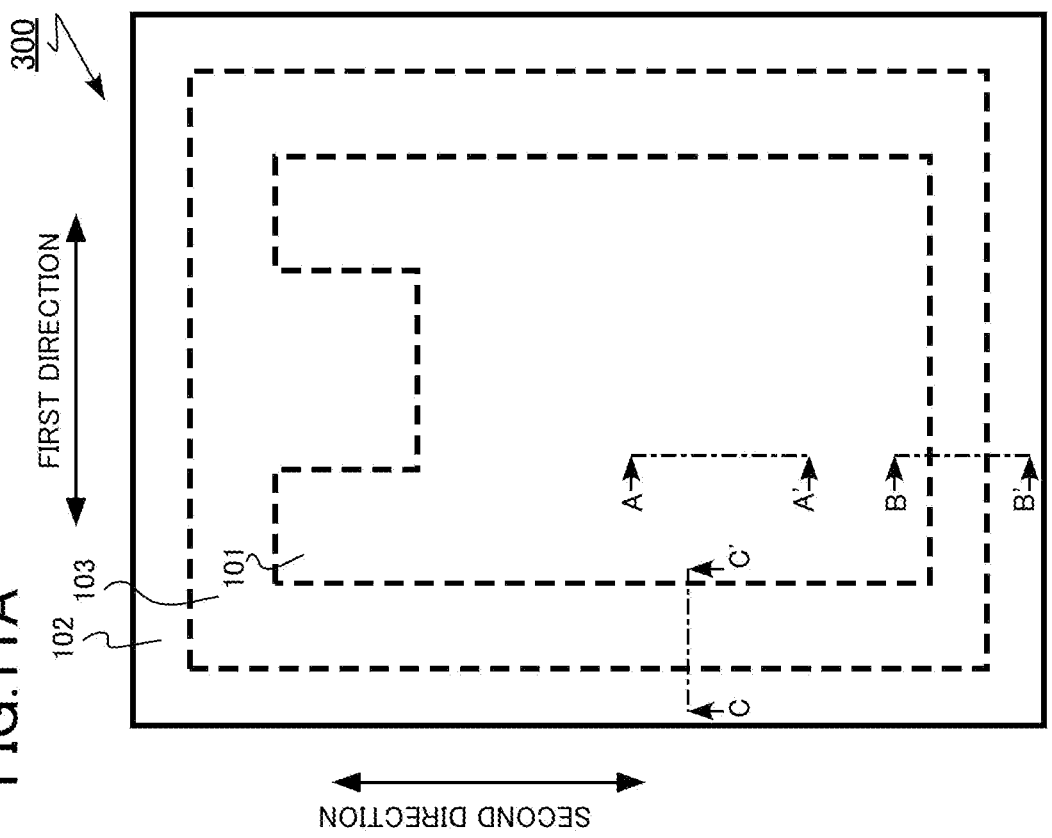

FIGS. 11A and 11B are schematic top views of the semiconductor device of the third embodiment. FIG. 11A shows a layout pattern of an element region, a termination region, and an intermediate region. FIG. 11B shows a layout pattern of a gate electrode, a gate wiring layer, and a gate pad electrode.

Figure 12:
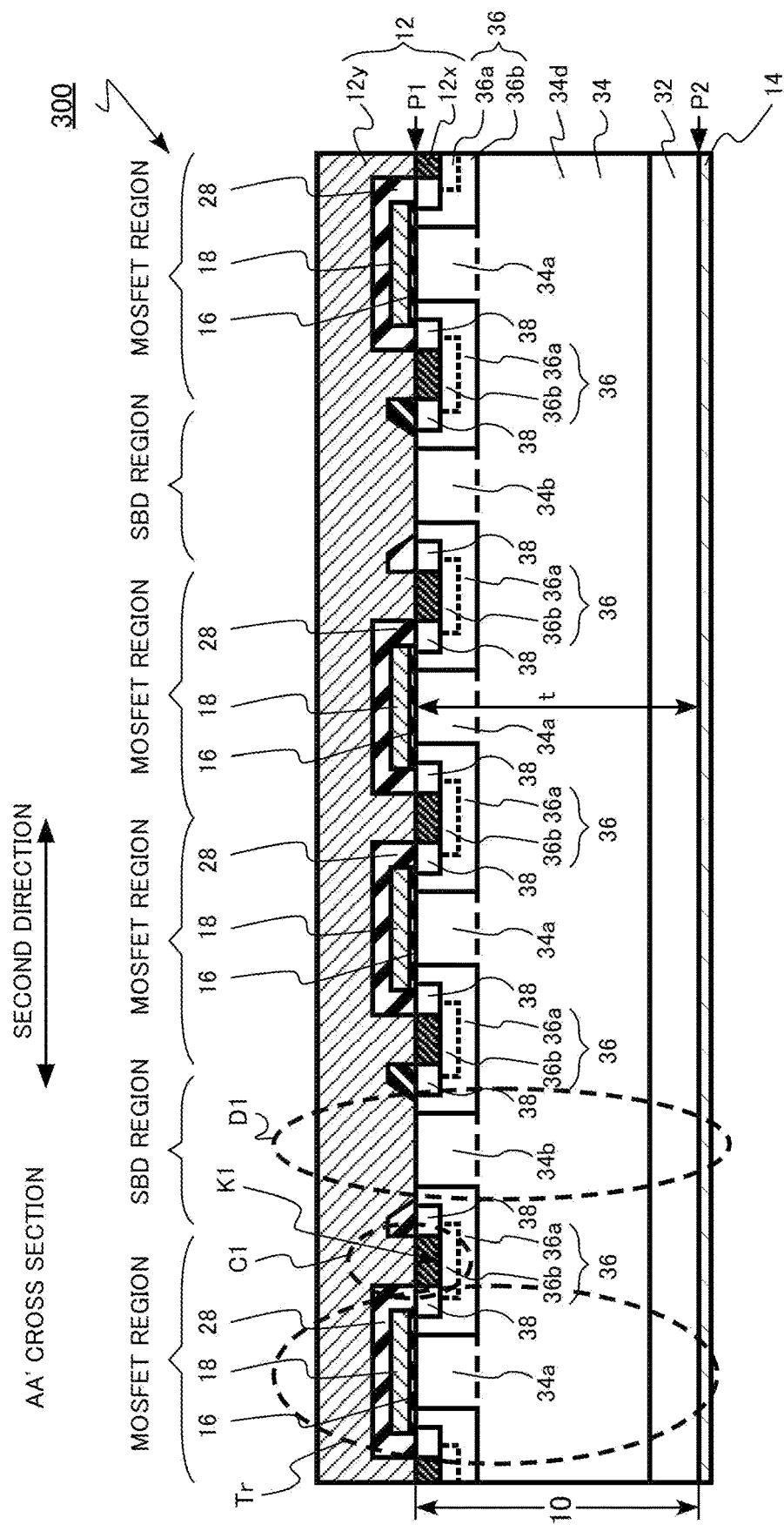
FIG. 12 is a schematic cross-sectional view of the semiconductor device of the third embodiment.

FIG. 12 is a schematic cross-sectional view of the semiconductor device of the third embodiment. FIG. 12 is a cross-sectional view taken along the line AA' of FIGS. 10A, 10B, 11A, and 11B.

Figure 13:
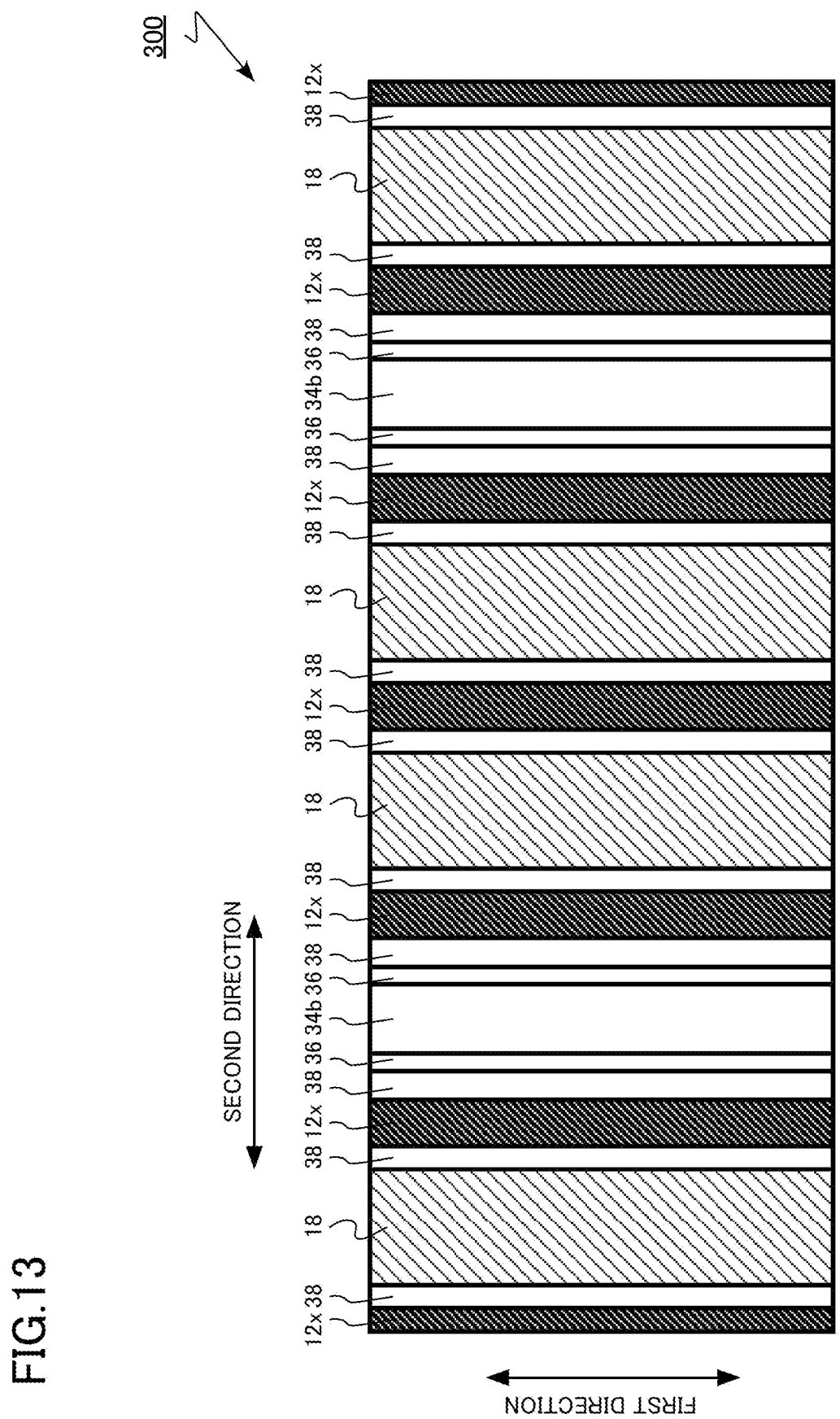
FIG. 13 is a schematic top view of the semiconductor device of the third embodiment.

FIG. 13 is a schematic top view of the semiconductor device of the third embodiment. FIG. 13 is a top view corresponding to FIG. 12. FIG. 13 shows a layout pattern on the side of a first face of a semiconductor layer. FIG. 13 shows a state in which a first electrode and an interlayer insulating layer are removed.

Figure 14:
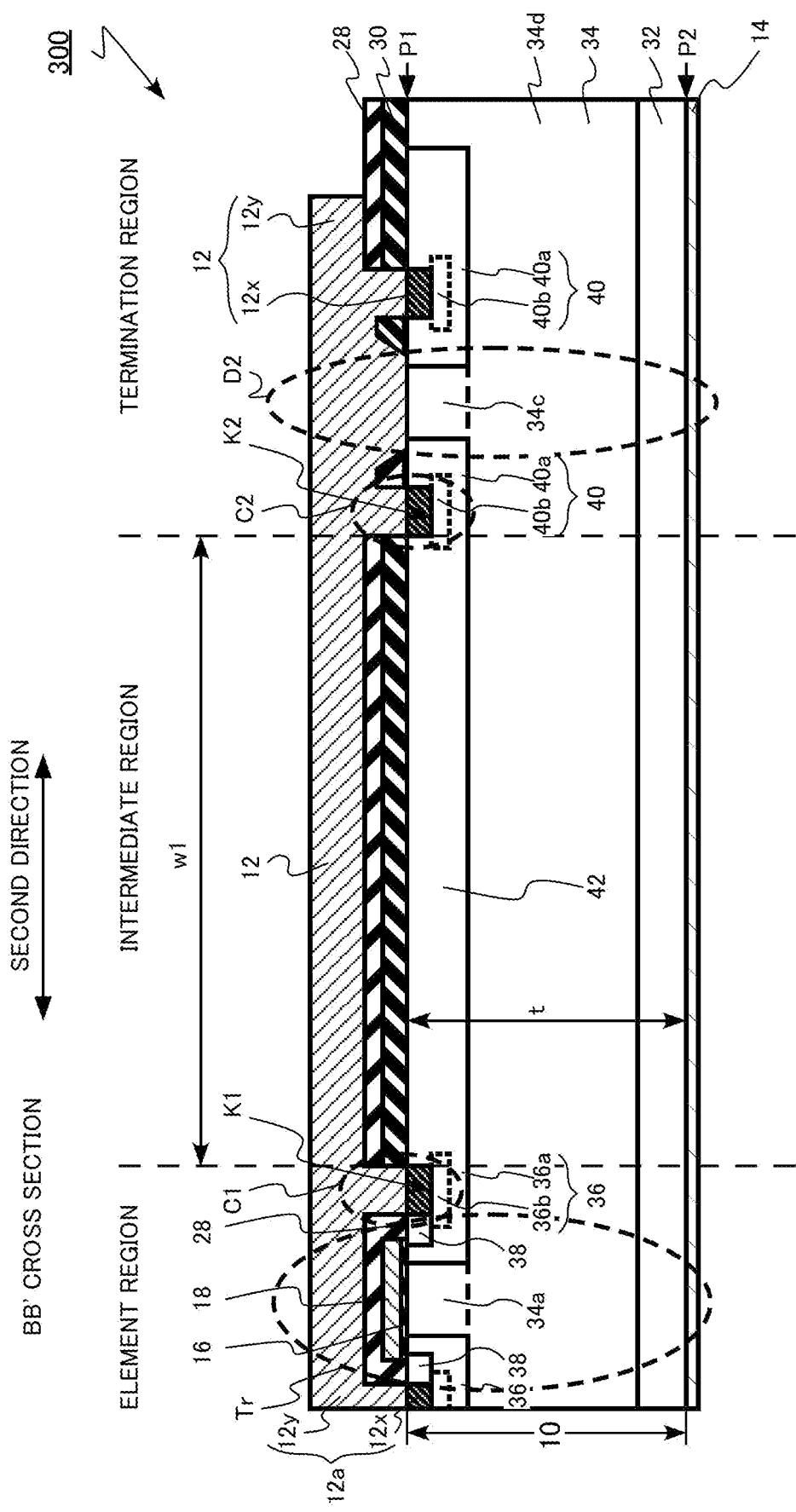
FIG. 14 is a schematic cross-sectional view of the semiconductor device of the third embodiment.

FIG. 14 is a schematic cross-sectional view of the semiconductor device of the third embodiment. FIG. 14 is a cross-sectional view taken along the line BB' of FIGS. 10A, 10B, 11A, and 11B.

Figure 15:
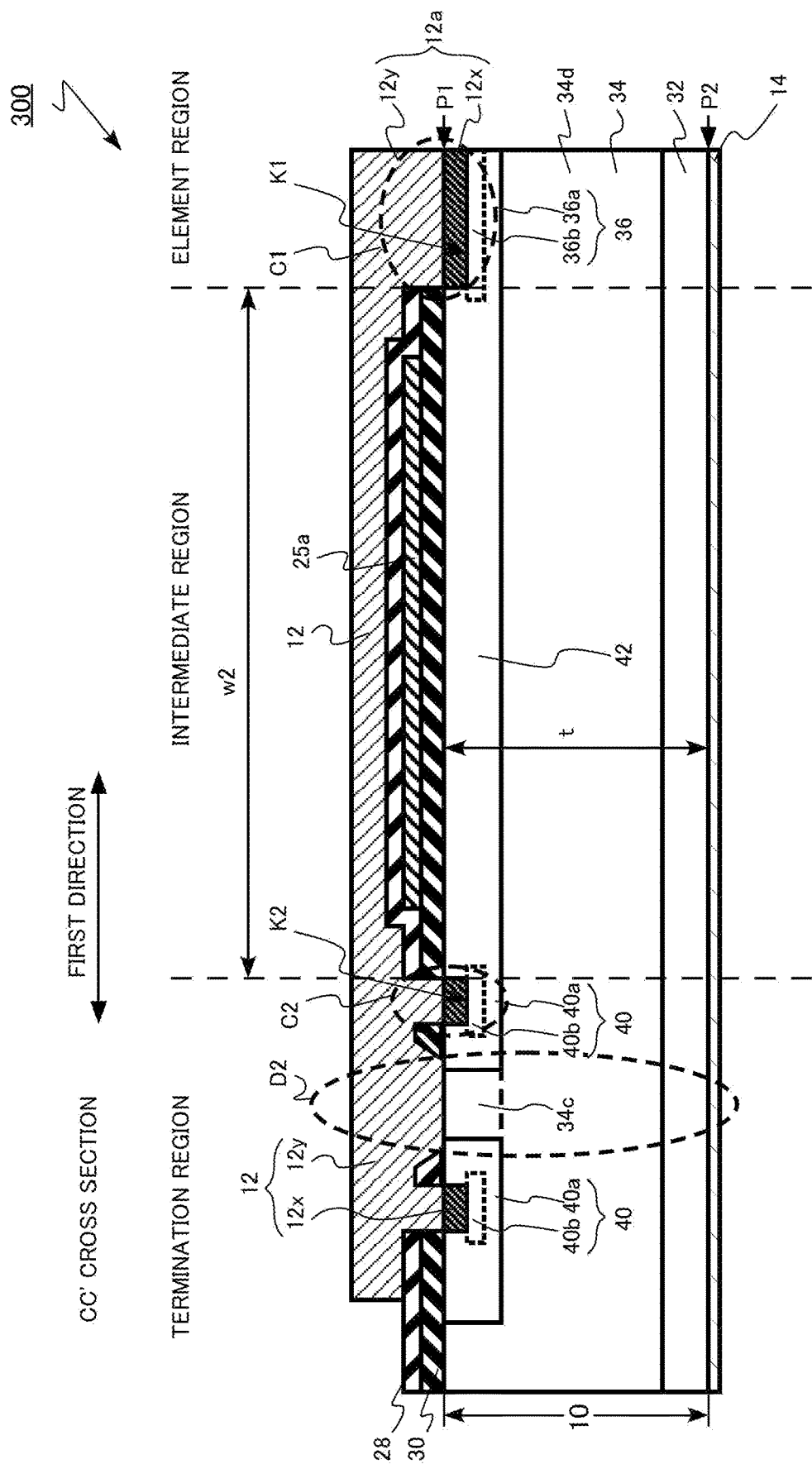
FIG. 15 is a schematic cross-sectional view of the semiconductor device of the third embodiment.

FIG. 15 is a schematic cross-sectional view of the semiconductor device of the third embodiment. FIG. 15 is a cross-sectional view taken along the line CC' of FIGS. 10A, 10B, 11A and 11B.

The semiconductor device of the third embodiment is a planar gate type vertical MOSFET 300 using silicon carbide. The MOSFET 300 is, for example, a DIMOSFET in which a body region and a source region are formed by ion implantation. In addition, the semiconductor device of the third embodiment includes an SBD as a built-in diode.

Hereinafter, a case where the first conductive type is n-type and the second conductive type is p-type will be described as an example. The MOSFET 400 is a vertical n-channel MOSFET having electrons as carriers.

The MOSFET 300 includes an element region 101, a termination region 102, and an intermediate region 103.

The element region 101 includes a plurality of MOSFET regions and a plurality of SBD regions. The MOSFET region includes a transistor Tr. The SBD region includes a first diode D1. The element region 101 includes a first contact portion C1. The termination region 102 includes a second contact portion C2 and a second diode D2.

The MOSFET 300 includes a silicon carbide layer 10, a source electrode 12 (first electrode), a drain electrode 14, a gate insulating layer 16, a gate electrode 16, a gate electrode pad 24, a gate wiring layer 25, an interlayer insulating layer 28, and a field insulating layer 30.

The source electrode 12 is an example of the first electrode. The drain electrode 14 is an example of the second electrode.

The silicon carbide layer 10 includes an it drain region 32, an $n^-$-type drift region 34 (first silicon carbide region), a p-type body region 36 (second silicon carbide region), an $n^+$-type source region 38 (third silicon carbide region), a p-type resurf region 40 (fourth silicon carbide region), and a p-type connection region 42 (fifth silicon carbide region). The drift region 34 has a JFET region 34a (first region), a first JBS region 34b (second region), a second JBS region 34c (third region), and a lower region 34d. The body region 36 has a low-concentration body region 36a and a high-concentration body region 36b. The resurf region 40 has a low-concentration resurf region 40a and a high-concentration resurf region 40b.

The drift region 34 is an example of the first silicon carbide region. The body region 36 is an example of the second silicon carbide region. The JFET region 34a is an example of the first region. The first JBS region 34b is an example of the second region. The second JBS region 34c is an example of a third region. The source region 38 is an example of the third silicon carbide region. The resurf region 40 is an example of the fourth silicon carbide region. The connection region 42 is an example of the fifth silicon carbide region.

As shown in FIG. 12 the element region 101 includes a plurality of MOSFET regions and a plurality of SBD regions. The MOSFET region includes a transistor Tr. The SBD region includes a first diode D1.

The MOSFET region extends in the first direction. The MOS FET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 300, the ratio between the number of MOSFET regions and the number of SBD regions is 2:1.

The ratio between the number of MOSFET regions and the number of SBD regions is not limited to 2:1. For example, the ratio between the number of MOSFET regions and the number of SBD regions may be 1:1 or 3:1 or any other ratio.

As shown in FIGS. 10B, 11B, and 12, the element region 101 includes the silicon carbide layer 10, the source electrode 12 (first electrode), the drain electrode 14 (second electrode), the gate insulating layer 16, the gate electrode 18, and the interlayer insulating layer 28.

The silicon carbide layer 10 in the element region 101 is provided between the source electrode 12 and the drain electrode 14. The silicon carbide layer 10 is a single crystal SiC. The silicon carbide layer 10 is, for example, 4H-SiC.

The silicon carbide layer 10 includes a first face ("P1" in FIG. 12) and a second face ("P2" in FIG. 12). Hereinafter, the first face P1 may be referred to as a surface, and the second face P2 may be referred to as a back surface. The first face P1 is disposed on the source electrode 12 side of the silicon carbide layer 10 in addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face in addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

The thickness of the silicon carbide layer 10 is equal to or more than 5 μm and equal to or less than 150 for example.

As shown in FIG. 12, the silicon carbide layer 10 in the element region 101 includes the n$^+$-type drain region 32, the n$^-$-type drift region 34 (first silicon carbide region), the p-type body region 36 (second silicon carbide region), and the n$^+$-type source region 38 (third silicon carbide region). The drift region 34 has the JFET region 34a (first region), the first JIBS region 34b (second region), and the lower region 34d. The body region 36 has the low-concentration body region 36a and the high-concentration body region 36b.

The n$^+$-type drain region 32 is provided on the back surface side of the silicon carbide layer 10. The drain region 32 contains, for example, nitrogen (N) as an n-type impurity. The n-type impurity concentration in the drain region 32 is equal to or more than $1\times10^{18}$ cm$^{-3}$ and equal to or less than $1\times10^{21}$ cm$^{-3}$, for example.

The n$^-$-type drift region 34 is provided between the drain region 32 and the first face P1. The n$^-$-type drift region 34 is provided between the source electrode 12 and the drain electrode 14. The n$^-$-type drift region 34 is provided between the gate electrode 18 and the drain electrode 14.

The n$^-$-type drift region 34 is provided on the drain region 32. The drift region 34 contains, for example, nitrogen (N) as an n-type impurity. The n-type impurity concentration in the drift region 34 is lower than the n-type impurity concentration in the drain region 32. The n-type impurity concentration in the drift region 34 is equal to or more than $4\times10^{14}$ cm$^{-3}$ and equal to or less than $1\times10^{17}$ cm$^{-3}$, for example. The thickness of the drift region 34 is equal to or more than 5 μm and equal to or less than 150 μm, for example.

The n$^-$-type drift region 34 has the JFET region 34a, the first JBS region 34b, and the lower region 34d.

The JFET region 34a is provided between the lower region 34d and the first face P1. The JFET region 34a is in contact with the first face P1. The JFET region 34a provided between two adjacent body regions 36.

The JFET region 34a extends in the first direction. The JFET region 34a faces the gate electrode 18 with the gate insulating layer 16 interposed therebetween.

The JFET region 34a functions as a current path for the MOSFET 300. The n-type impurity concentration in the JFET region 34a is higher than, for example, the n-type impurity concentration in the lower region 34d. The n-type impurity concentration in the JFET region 34a is equal to or more than $5\times10^{16}$ cm$^{-3}$ and equal to or less than $2\times10^{17}$ cm$^{-3}$, for example.

The first. JBS region 34b is provided between the lower region 34d and the first face P1. The first JBS region 34b is in contact with the first face P1. The first JBS region. 34b is provided between the two body regions 36 adjacent to each other.

The first JBS region 34b extends in the first direction. The first JBS region 34b is in contact with the source electrode 12.

The first diode D1 is an SBD. The n-type impurity concentration in the first JBS region 34b is higher than, for example, the n-type impurity concentration in the lower region 34d. The n-type impurity concentration in the first JBS region 34b is equal to or more than $5\times10$ cm$^{16}$ cm$^{-3}$ and equal to or less than $2\times10^{17}$ cm$^{-3}$, for example.

The p-type body region 36 is provided between the drift region 34 and the first face P1. The body region. 36 extends in the first direction. The body region 36 functions as a channel region of the MOSFET 300. The body region. 36 functions as a channel region of the transistor Tr.

The depth of the body region 36 is equal to or more than 0.5 μm and equal to or less than 1.0 μm for example.

The body region 36 is electrically connected to the source electrode 12. The body region 36 is fixed to the electric potential of the source electrode 12.

A part of the body region. 36 is in contact with the first face P1. A part of the body region 36 faces the gate electrode 18. A part of the body region 36 becomes a channel region of the MOSFET 300. The gate insulating layer 16 is interposed between a part of the body region 36 and the gate electrode 18.

The body region 36 is adjacent to the JFET region 34a. The body region 36 is in contact with the JFET region 34a.

The body region 36 has the low-concentration body region 36a and the high-concentration body region 36b. The high-concentration body region 36b is provided between the low-concentration body region 36a and the source electrode 12. The high-concentration body region 36b is in contact with the source electrode 12.

The body region 36 contains, for example, aluminum (Al) as a p-type impurity. The p-type impurity concentration in the low-concentration body region 36a is lower than the p-type impurity concentration in the high-concentration body region 36b. The p-type impurity concentration in the low-concentration body region 36a is equal to or more than $5\times10^{17}$ cm$^{-3}$ and equal to or less than $5\times10^{19}$ cm$^{-3}$, for example. The p-type impurity concentration in the high-concentration body region 36b is equal to or more than $1\times10^{19}$ cm$^{-3}$ and equal to or less than $1\times10^{21}$ cm$^{-3}$, for example.

The body region 36 is electrically connected to the source electrode 12. The contact between the body region 36 and the source electrode 12 is, for example, an ohmic contact. The body region 36 is fixed to the electric potential of the source electrode 12.

The n+-type source region 38 is provided between the body region 36 and the first face P1. The source region 38 extends in the first direction.

The source region 38 contains, for example, phosphorus (P) or nitrogen (N) as an n-type impurity. The n-type impurity concentration in the source region 38 is higher than the n-type impurity concentration in the drift region 34.

The n-type impurity concentration in the source region 38 is equal to or more than $1\times10^{19}$ cm$^{-3}$ and equal to or less than $1\times10^{21}$ cm$^{-3}$, for example. The depth of the source region 38 is smaller than the depth of the body region 36. The depth of the source region 38 is equal to or more than 0.05 μm and equal to or less than 0.2 μm, for example.

The source region 38 is in contact with the source electrode 12. The source region 38 is electrically connected to the source electrode 12. The contact between the source region 38 and the source electrode 12 is, for example, an ohmic contact. The source region 38 is fixed to the electric potential of the source electrode 12.

The gate electrode 18 is provided on the first face P1 of the silicon carbide layer 10. The gate electrode 18 extends in the first direction. A plurality of gate electrodes 18 are arranged in parallel with each other in the second direction. The gate electrode 18 has a striped shape.

The gate electrode 18 is a conductive layer. The gate electrode 18 is, for example, polycrystalline silicon containing p-type impurities or n-type impurities.

The gate electrode 18 faces the body region 36. The gate electrode 18 faces the JFET region 34a.

The gate insulating layer 16 is provided between the gate electrode 18 and the body region 36. The gate insulating layer 16 is provided between the gate electrode 18 and the JFET region 34a. The gate insulating layer 16 is provided between the gate electrode 13 and the source region 38.

The gate insulating layer 16 is, for example, silicon oxide. For example, a high-k insulating material (insulating material with a high dielectric constant) can be applied to the gate insulating layer 16.

The interlayer insulating layer 28 is provided on the gate electrode 18 and the silicon carbide layer 10. The interlayer insulating layer 28 is, for example, silicon oxide.

The source electrode 12 is in contact with the silicon carbide layer 10. The source electrode 12 is in contact with the source region 38. The source electrode 12 is in contact with the body region 36 at the first interface (K1 in FIG. 12). The source electrode 12 is in contact with the high-concentration body region 36b at the first interface (K1 in FIG. 12). The source electrode 12 is in contact with the source region. 38 at the first interface K1. The source electrode 12 is in contact with the first JBS region 34b.

The source electrode 12 is in contact with the silicon carbide layer 10. The source electrode 12 is in contact with the source region 38. The source electrode 12 is in contact with the body region 36. The source electrode 12 is in contact with the high-concentration body region 36b. The source electrode 12 is in contact with the first JBS region 34b.

The source electrode 12 has, for example, a silicide layer 12x and a metal layer 12y. The silicide layer 12x is provided between the silicon carbide layer 10 and the metal layer 12y. The silicide layer 12x extends in the first direction.

The silicide layer 12x is in contact with the source region 38. The silicide layer 12x is in contact with the body region 36. The silicide layer 12x is in contact with the high-concentration body region 36b.

The source electrode 12 functions as an anode of the first diode D1.

The suicide layer 12x of the source electrode 12 contains silicide. The silicide layer 12x is, for example, nickel silicide or titanium silicide.

The contact between the source electrode 12 and the source region 38 becomes an ohmic contact by providing the silicide layer 12x. The contact between the source electrode 12 and the body region 36 becomes an ohmic contact by providing the silicide layer 12x. The contact between the source electrode 12 and the high-concentration body region 36b becomes an ohmic contact by providing the silicide layer 12x.

The metal layer 12y of the source electrode 12 contains metal. The metal layer 12y has, for example, a stacked structure of titanium (Ti) and aluminum. (Al).

The metal layer 12y is in contact with the first JBS region 34b. The contact between the source electrode 12 and the first JBS region 34b is a Schottky contact. The contact between the metal layer 12y and the first JBS region 34b is a Schottky contact.

The drain electrode 14 is provided on the back surface of the silicon carbide layer 10. The drain electrode 14 is in contact with the drain region 32.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

As shown in FIG. 12, the transistor Tr includes the gate electrode 18, the gate insulating layer 16, the JFET region 34a, the body region 36, the source region 38, the source electrode 12, and the drain electrode 14. When the MOSFFT 300 is in the ON state, a current flows from the drain electrode 14 to the source electrode 12 due to the transistor Tr.

As shown in FIG. 12, the first diode D1 includes the source electrode 12, the first JBS region 34b, and the drain electrode 14. When a forward bias is applied to the first diode D1, a current flows from the source electrode 12 to the drain electrode 14.

As shown in FIG. 12, the first contact portion C1 includes the source electrode 12, the first interface K1, and the body region 36. The first contact portion C1 includes the high-concentration body region 36b. The first contact portion C1 includes the source region 38.

The electric potential of the body region 36 is fixed to the electric potential of the source electrode 12 by the first contact portion C1. By providing the first contact portion C1, the electric potential of the body region 36 is stabilized and the operation of the MOSFET 300 is stabilized.

The termination region 102 surrounds the element region 101, as shown in FIG. 10A. The termination region 102 includes the second diode D2. The termination region 102 has a function of increasing the dielectric breakdown voltage of the MOSFET 300 by reducing the strength of the electric field applied to the termination portion of the pn junction in the element region 101 when the MOSFET 300 is in the off state.

As shown in FIGS. 10B, 14, and 15, the termination region 102 includes the silicon carbide layer 10, the source electrode 12 (first electrode), the drain electrode 14 (second electrode), the inter) aver insulating layer 28, and the field insulating layer 30.

The silicon carbide layer 10 in the termination region 102 is provided between the source electrode 12 and the drain electrode 14.

As shown in FIGS. 14 and 15, the silicon carbide layer 10 in the termination region 102 includes the n+-type drain region 32, the n⁻-type drift region 34 (first silicon carbide region), and the p-type resurf region 40 (fourth silicon carbide region). The drift region 34 has the second JBS region 34c (third region) and the lower region 34d. The resurf region 40 has the low-concentration resurf region 40a and the high-concentration resurf region 40b.

The n+-type drain region 32 is provided on the back surface side of the silicon carbide layer 10. The drain region 32 contains, for example, nitrogen (N) as an n-type impurity.

The n⁻-type drift region 34 is provided between the drain region 32 and the first face P1. The n⁻-type drift region 34 is provided between the source electrode 12 and the drain electrode 14.

The n⁻-type drift region 34 is provided on the drain region 32. The drift region 34 contains, for example, nitrogen (N) as an n-type impurity.

The n⁻-type drift region 34 has the second JBS region 34c and the lower region 34d.

The second JBS region 34c is provided between the lower region 34d and the first face P1. The second JBS region 34c is in contact with the first face P1. The second JBL region 34c is provided between the two resurf regions 40 adjacent to each other. The second JBS region 34c is in contact with the source electrode 12.

The second diode D2 is an SBD. The n-type impurity concentration in the second JBS region 34c is higher than, for example, the n-type impurity concentration in the lower region 34d. The n-type impurity concentration in the second JBS region 34c is equal to or more than $5 \times 10^{16}$ cm⁻³ and equal to or less than $2 \times 10^{17}$ cm⁻³, for example.

The p-type resurf region 40 is provided between the drift region 34 and the first face P1. The depth of the resurf region 40 is equal to or more than 0.5 μm and equal to or less than 1.0 μm, for example.

The resurf region 40 is electrically connected to the source electrode 12. The contact between the resurf region 40 and the source electrode 12 is, for example, an ohmic contact. The resurf region 40 is fixed to the electric potential of the source electrode 12.

The resurf region 40 has the low-concentration resurf region 40a and the high-concentration resurf region 40b. The high-concentration resurf region 40b is provided between the low-concentration resurf region 40a and the source electrode 12. The high-concentration resurf region 40b is in contact with the source electrode 12.

The resurf region 40 contains, for example, aluminum (Al) as a p-type impurity. The p-type impurity concentration in the low-concentration resurf region 40a is lower than the p-type impurity concentration in the high-concentration resurf region 40b. The p-type impurity concentration in the low-concentration resurf region 40a is equal to or more than $5 \times 10^{17}$ cm⁻³ and equal to or less than $5 \times 10^{19}$ cm⁻³, for example. The p-type impurity concentration in the high-concentration resurf region 40b is equal to or more than $1 \times 10^{19}$ cm⁻³ and equal to or less than $1 \times 10^{21}$ cm⁻³, for example.

The interlayer insulating layer 28 is provided on the field insulating layer 30. The interlayer insulating layer 28 is, for example, silicon oxide.

The field insulating layer 30 is provided on the silicon carbide layer 10. The field insulating layer 30 is, for example, silicon oxide.

The source electrode 12 is in contact with the silicon carbide layer 10. The source electrode 12 is in contact with the resurf region 40 at the second interface (K2 in FIG. 14). The source electrode 12 is in contact with the high-concentration resurf region 40b at the second interface (K2 in FIG. 14).

The source electrode 12 has, for example, a silicide layer 12x and a metal layer 12y. The silicide layer 12x is provided between the silicon carbide layer 10 and the metal layer 12y.

The silicide layer 12x is in contact with the resurf region 40. The silicide layer 12x is in contact with the high-concentration resurf region 40b.

The source electrode 12 functions as an anode of the second diode D2.

The silicide layer 12x of the source electrode 12 contains silicide. The silicide layer 12x is, for example, nickel silicide or titanium silicide.

The contact between the source electrode 12 and the resurf region 40 becomes an ohmic contact by providing the silicide layer 12x. The contact between the source electrode 12 and the high-concentration resurf region 40b becomes an ohmic contact by providing the silicide layer 12x.

The metal layer 12y of the source electrode 12 contains metal. The metal layer 12y has, for example, a stacked structure of titanium (Ti) and aluminum (Al).

The metal layer 12y is in contact with the second JBS region 34c. The contact between the source electrode 12 and the first. JBS region 34b is a Schottky contact. The contact between the metal layer 12y and the second. JBS region 34c is a Schottky contact.

The drain electrode 14 is provided on the back surface of the silicon carbide layer 10. The drain electrode 14 is in contact with the drain region 32.

As shown in FIGS. 14 and 15, the second diode D2 includes the source electrode 12, the second. JBS region 34c, and the drain electrode 14. When a forward bias is applied to the second diode D2, a current flows from the source electrode 12 to the drain electrode 14.

As shown in FIGS. 14 and 15, the second contact portion C2 includes the source electrode 12, the second interface K2, and the resurf region 40. The second contact portion C2 includes the high-concentration resurf region 40b.

The electric potential of the resurf region 40 is fixed to the electric potential of the source wiring layer 20 by the second contact portion C2. By providing the second contact portion C2, for example, the dielectric breakdown voltage of the MOSFET 300 is stabilized.

As shown in FIG. 10A, the intermediate region 103 is provided between the element region 101 and the termination region 102. The intermediate region 103 surrounds the element region 101. The termination region 102 surrounds the intermediate region 103.

The intermediate region 103 does not include the transistor Tr, the first diode D1, the second diode D2, the first contact portion C1, and the second contact portion C2.

As shown in FIGS. 10B, 11B, 14, and 15, the intermediate region 103 includes the silicon carbide layer 10, the source electrode 12, the gate electrode pad 24, the gate wiring layer 25, the drain electrode 14 (second electrode), the interlayer insulating layer 28, and the field insulating layer 30.

The silicon carbide layer 10 in the intermediate region 103 is provided between the source electrode 12 and the drain electrode 14 and between the gate electrode pad 24 and the drain electrode 14.

As shown in FIGS. 14 and 15, the silicon carbide layer 10 in the intermediate region 103 includes the n+-type drain region 32, the n⁻-type drift region 34 (first silicon carbide region), and the p-type connection region 42 (fifth silicon carbide region).

The n⁺-type drain region 32 is provided on the back surface side of the silicon carbide layer 10. The drain region 32 contains, for example, nitrogen (N) as an n-type impurity.

The n⁻-type drift region 34 is provided between the drain region 32 and the first face P1. The n⁻-type drift region 34 is provided between the source electrode 12 and the drain electrode 14.

The n⁻-type drift region 34 is provided on the drain region 32. The drift region 34 contains, for example, nitrogen as an n-type impurity.

The n⁻-type drift region 34 has the lower region 34d.

The p-type connection region 42 is provided between the drift region 34 and the first face P1. The depth of the connection region 42 is equal to or more than 0.5 μm and equal to or less than 1.0 μml, for example.

The connection region 42 is provided between the body region 36 and the resurf region 40. The connection region 42 is in contact with, for example, the body region 36. The connection region 42 is in contact with, for example, the resurf region 40. The connection region 42, the body region 36, and the resurf region 40 are, for example, continuous. The connection region 42, the body region 36, and the resurf region 40 are simultaneously formed by using, for example, the same manufacturing process.

The connection region 42 is electrically connected to the source electrode 12 through the body region 36, for example. The connection region 42 is electrically connected to the source electrode 12 through, for example, the resurf region 40. The connection region 42 is fixed to, for example, the electric potential of the source electrode 12.

The connection region 42 contains, for example, aluminum (Al) as a p-type impurity. The p-type impurity concentration in the connection region 42 is equal to or more than $5 \times 10^{17}$ cm$^{-3}$ and equal to or less than $5 \times 10^{19}$ cm$^{-3}$, for example.

The gate wiring layer 25 is provided between the source electrode 12 and the silicon carbide layer 10. The gate wiring layer 25 is electrically connected to the gate electrode pad 24. The gate wiring layer 25 is electrically connected to the gate electrode 18. The gate wiring layer 25 is in contact with, for example, the gate electrode 18.

The gate wiring layer 25 includes a first gate line 25a extending in the second direction and a second gate line 25b extending in the second direction. The gate electrode 18 is interposed between the first gate line 25a and the second gate line 25b.

The gate wiring layer 25 is a conductive layer. The gate wiring layer 25 is, for example, polycrystalline silicon containing p-type impurities or n-type impurities. The gate wiring layer 25 has, for example, a stacked structure of polycrystalline silicon containing p-type impurities or n-type impurities and silicide.

The electrical resistance per unit length of the gate wiring layer 25 in the second direction is lower than the electrical resistance per unit length of the gate electrode 18 in the first direction, for example. The unit length is, for example, an arbitrary length equal to or more than 1 μm and equal to or less than 100 μm.

For example, the electrical resistance per unit length of the first gate line 25a in the second direction is lower than the electrical resistance per unit length of the gate electrode 18 in the first direction. In addition, for example, the electrical resistance per unit length of the second gate line 25b in the second direction is lower than the electrical resistance per unit length of the gate electrode 18 in the first direction.

For example, the width of the gate wiring layer 25 in the first direction is equal to or more than 20 times and equal to or less than 100 times the width of the gate electrode 18 in the second direction. For example, the width (w1x in FIG. 11B) of the first gate line 25a in the first direction is equal to or more than 20 times and equal to or less than 100 times the width (w2 in FIG. 11B) of the gate electrode 18 in the second direction. For example, the width (w2x in FIG. 11B) of the second gate line 25b in the first direction is equal to or more than 20 times and equal to or less than 100 times the width (w2 in FIG. 11B) of the gate electrode 18 in the second direction.

By setting the width of the gate wiring layer 25 in the first direction to be equal to or more than 20 times the width of the gate electrode 18 in the second direction, the electrical resistance per unit length of the gate wiring layer 25 in the second direction becomes lower than the electrical resistance per unit length of the gate electrode 18 in the first direction.

For example, the sheet resistance of the gate wiring layer 25 is lower than the sheet resistance of the gate electrode 18. For example, the sheet resistance of the first gate line 25a is lower than the sheet resistance of the gate electrode 13. In addition, for example, the sheet resistance of the second gate line 25b is lower than the sheet resistance of the gate electrode 13.

By setting the sheet resistance of the gate wiring layer 25 to be lower than the sheet resistance of the gate electrode 18, the electrical resistance per unit length of the gate wiring layer 25 in the second direction becomes lower than the electrical resistance per unit length of the gate electrode 18 in the first direction.

For example, the gate wiring layer 25 is polycrystalline silicon containing n-type impurities, and the gate electrode 18 is polycrystalline silicon containing p-type impurities. For example, the first gate line 25a is polycrystalline silicon containing n-type impurities, and the gate electrode 18 is polycrystalline silicon containing p-type impurities. In addition, for example, the second gate line 25b is polycrystalline silicon containing n-type impurities, and the gate electrode 18 is polycrystalline silicon containing p-type impurities.

The n-type impurity is, for example, phosphorus (P) or arsenic (As). The p-type impurity is, for example, boron (B).

By using polycrystalline silicon containing n-type impurities for the gate wiring layer 25 and polycrystalline silicon containing p-type impurities for the gate electrode 18, it becomes easy to make the sheet resistance of the gate wiring layer 25 lower than the sheet resistance of the gate electrode 10. Therefore, it becomes easy to make the electrical resistance per unit length of the gate wiring layer 25 in the second direction lower than the electrical resistance per unit length of the gate electrode 18 in the first direction.

For example, the gate wiring layer 25 has a stacked structure of polycrystalline silicon containing n-type impurities or p-type impurities and silicide, and the gate electrode 13 has a single-layer structure of polycrystalline silicon containing n-type impurities or p-type impurities. For example, the first gate line 25a has a stacked structure of polycrystalline silicon containing n-type impurities or p-type impurities and silicide, and the gate electrode 18 has a single-layer structure of polycrystalline silicon containing n-type impurities or p-type impurities. In addition, for example, the second gate line 25b has a stacked structure of polycrystalline silicon containing n-type impurities or p-type impurities and silicide, and the gate electrode 18 has a single-layer structure of polycrystalline silicon containing n-type impurities or p-type impurities.

By making the gate wiring layer 25 have a stacked structure of polycrystalline silicon containing n-type impurities or p-type impurities and silicide and the gate electrode 18 have a single-layer structure of polycrystalline silicon containing n-type impurities or p-type impurities, impurities, it becomes easy to make the sheet resistance of the gate wiring layer 25 lower than the sheet resistance of the gate electrode 18. Therefore, it becomes easy to make the electrical resistance per unit length of the gate wiring layer 25 in the second direction lower than the electrical resistance per unit length of the gate electrode 18 in the first direction.

The interlayer insulating layer 28 is provided on the field insulating layer 30. The interlayer insulating layer 28 is, for example, silicon oxide.

The field insulating layer 30 is provided on the silicon carbide layer 10. The field insulating layer 30 is, for example, silicon oxide.

The gate electrode pad 24 is provided on the first face P1 side of the silicon carbide layer 10. The gate electrode pad 24 contains metal. The gate electrode pad 24 has, for example, a stacked structure of titanium (Ti) and aluminum (Al).

The gate electrode 18 provided in the element region 101 is electrically connected to the gate electrode pad 24 through the gate wiring layer 25.

The drain electrode 14 is provided on the back surface of the silicon carbide layer 10. The drain electrode 14 is in contact with the drain region 32.

The width of the intermediate region 103 in the second direction from the element, region. 101 to the termination region 102 is equal to or more than twice the thickness of the silicon carbide layer 10. The width of the intermediate region 103 is, for example, a distance between the first contact portion C1 and the second contact portion C2 in the second direction.

For example, the first width (w1 in FIG. 14) of the intermediate region 103 in the second direction from the element region 101 to the termination region 102 is equal to or more than twice the thickness (t in FIG. 14) of the silicon carbide layer 10. In addition, for example, the second width (w2 in FIG. 15) of the intermediate region 103 including the first gate line 25a of the gate wiring layer 25 in the first direction from the element region 101 to the termination region 102 is equal to or more than twice the thickness (t in FIG. 15) of the silicon carbide layer 10.

Next, the function and effect of the MOSFET 300 of the third embodiment will be described.

The MOSFET 300 includes an SBD. A forward voltage (Vf) at which a forward current starts to flow through the SBD is lower than a forward voltage (Vf) of the pn junction diode. Therefore, a forward current flows through the SBD prior to the pn junction diode.

The forward voltage (Vf) of the SBD is equal to or more than 1.0 V and less than 2.0 V, for example. The forward voltage (Vf) of the pn junction diode is equal to or more than 2.0 V and equal to or less than 3.0 V, for example.

The SBD operates in a unipolar manner. Therefore, even if a forward current flows, no stacking fault grows in the silicon carbide layer 10 due to the recombination energy of the carriers. Therefore, the increase in the on-resistance of the MOSFET 300 is suppressed. As a result, the reliability of the MOSFET 300 is improved.

A high surge voltage that momentarily makes the source electrode 12 positive may be applied between the source electrode 12 and the drain electrode 14 of the MOSFET 300. When a high surge voltage is applied, a large surge current flows through the MOSFET 300, and the MOSFET 300 may break down.

The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

When a surge voltage is applied to the MOSFET 300, a forward voltage is applied to the pn junction between the drift region 34 and the body region 36 in the element region 101. When the voltage applied to the pn junction exceeds the forward voltage (Vf) of the pn junction diode, hole injection from the first contact portion C1 into the drift region 34 starts. Holes are injected from the first contact portion C1 into the drift region 34 through the body region 36.

When hole injection from the first contact portion C1 into the drift region. 34 starts, conductivity modulation occurs to reduce the resistance of the drift region 34. When the resistance of the drift region 34 is reduced, a large forward current flows between the source electrode 12 and the drain electrode 14. In other words, due to the bipolar operation of the pn junction diode, a large surge current flows between the source electrode 12 and the drain electrode 14.

Since the large surge current flows between the source electrode 12 and the drain electrode 14, the element region 101 generates heat. When thermal breakdown of the element region 101 occurs due to heat generation, the MOSFET 300 breaks down.

Figure 16:
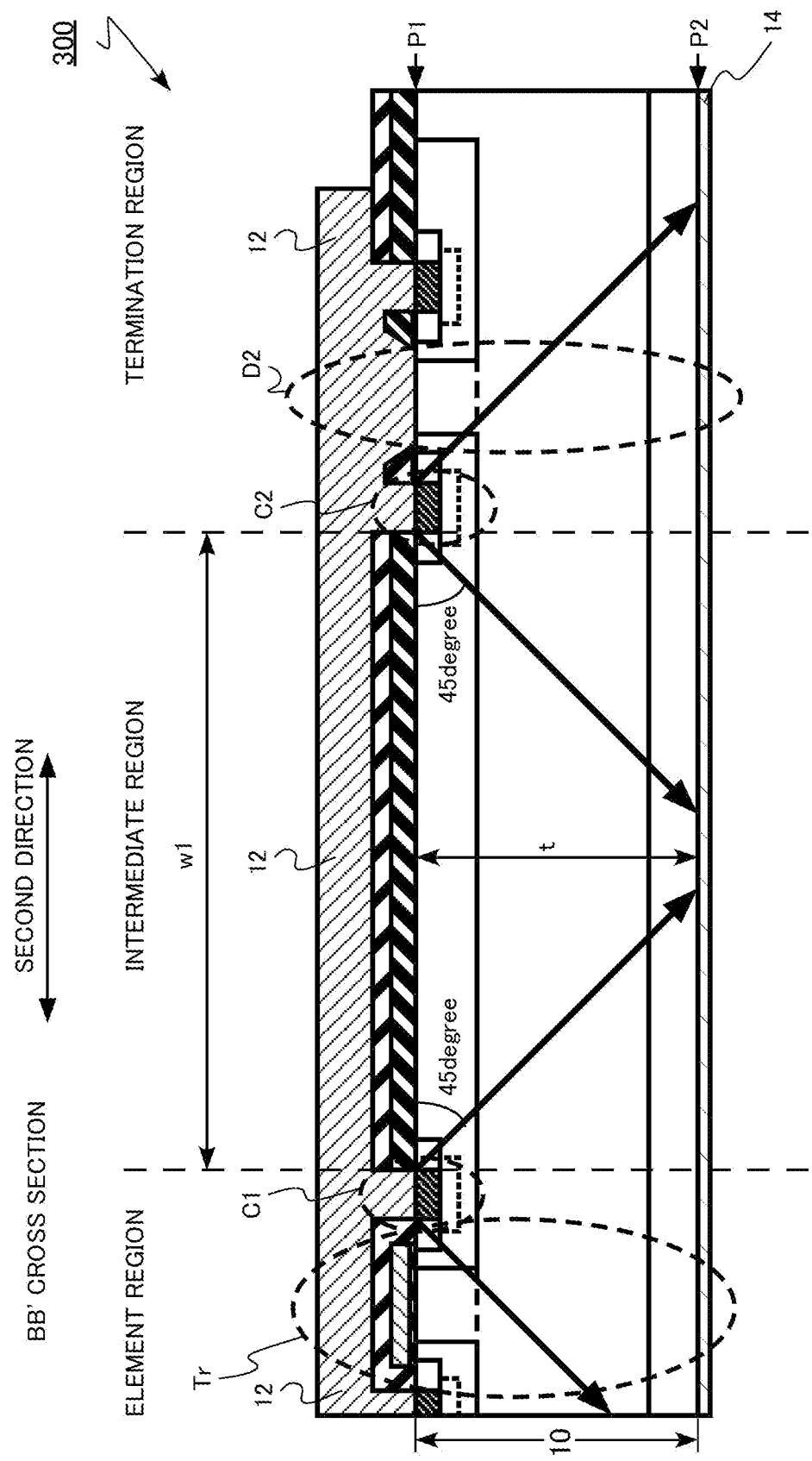
FIG. 16 is an explanatory diagram of the function and effect of the semiconductor device of the third embodiment.

FIG. 16 is an explanatory diagram of the function and effect of the semiconductor device of the third embodiment. FIG. 16 is a schematic cross-sectional view of the semiconductor device of the third embodiment. FIG. 16 is a diagram corresponding to FIG. 14.

In the MOSFET 300 of the third embodiment, the width of the intermediate region 103 in the second direction from the element region 101 to the termination region 102 is equal to or more than twice the thickness of the silicon carbide layer 10. For example, the first width (w1 in FIG. 14) of the intermediate region 103 in the second direction from the element region 101 to the termination region 102 is equal to or more than twice the thickness (t in FIG. 14) of the silicon carbide layer 10. In addition, for example, the second width (w2 in FIG. 15) of the intermediate region 103 including the first gate line 25a of the gate wiring layer 25 in the first direction from the element region 101 to the termination region 102 is equal to or more than twice the thickness (t in FIG. 15) of the silicon carbide layer 10.

Since the width of the intermediate region. 103 is equal to or more than twice the thickness of the silicon carbide layer 10, as shown in FIG. 16, the diffusion current flowing from the first contact portion C1 and the diffusion current flowing from the second contact portion C2 do not cross each other at the bottom of the silicon carbide layer 10. Since the diffusion currents do not cross each other at the bottom of the silicon carbide layer 10, the conductivity modulation is not promoted. The resistance of the drift region 34 is not further reduced, and the surge current flowing through the termination region 102 is suppressed. Therefore, heat generation in the termination region 102 is suppressed, and thermal breakdown in the termination region 102 is suppressed. As a result, the surge current withstand capacity of the MOSFET 300 is improved.

From the viewpoint of improving the surge current withstand capacity of the MOSFET 300, the width of the intermediate region 103 in the second direction from the element region 101 to the termination region 102 is preferably equal to or more than 2.5 times, more preferably equal to or more than 3 times the thickness of the silicon carbide layer 10.

As the width of the intermediate region 103 increases, the occupancy rate of the element region 101 of the MOSFET 300 decreases. As the occupancy rate of the element region 101 of the MOSFET 300 decreases, the on-current of the MOSFET 300 decreases.

From the viewpoint of increasing the on-current of the MOSFET 300, the width of the intermediate region 103 in the direction from the element region 101 to the termination region 102 is preferably equal to or less than 10 times, more preferably equal to or less than 5 times the thickness of the silicon carbide layer 10. For example, the second width (w2 in FIG. 15) of the intermediate region. 103 including the first gate line 25a of the gate wiring layer 25 in the first direction from the element region 101 to the termination region 102 is preferably equal to or less than 10 times, more preferably equal to or less than 5 times the thickness (t in FIG. 15) of the silicon carbide layer 10. In addition, for example, the first width (w1 in FIG. 14) of the intermediate region 103 in the second direction from the element region 101 to the termination region 102 is preferably equal to or less than 10 times, more preferably equal to or less than 5 times the thickness (t in FIG. 14) of the silicon carbide layer 10.

The termination region 102 preferably includes the second diode D2. By providing the second diode D2 in the termination region 102, the starting voltage of hole injection from the second contact portion C2 into the drift region 34 rises. By increasing the starting voltage from the second contact portion C2 to the hole injection in the drift region 34, the conductivity modulation in the drift region 34 of the termination region 102 is suppressed. Therefore, heat generation in the termination region 102 is suppressed, and thermal breakdown in the termination region 102 is suppressed.

As described above, according to the third embodiment, a MOSFET in which thermal breakdown in the termination region is suppressed and the surge current withstand capacity is improved is realized.

Fourth Embodiment

A semiconductor device of a fourth embodiment is different from the semiconductor device of the third embodiment in that the termination region does not include the second diode. Hereinafter, the description of a part of the content overlapping the third embodiment may be omitted.

Figure 17:
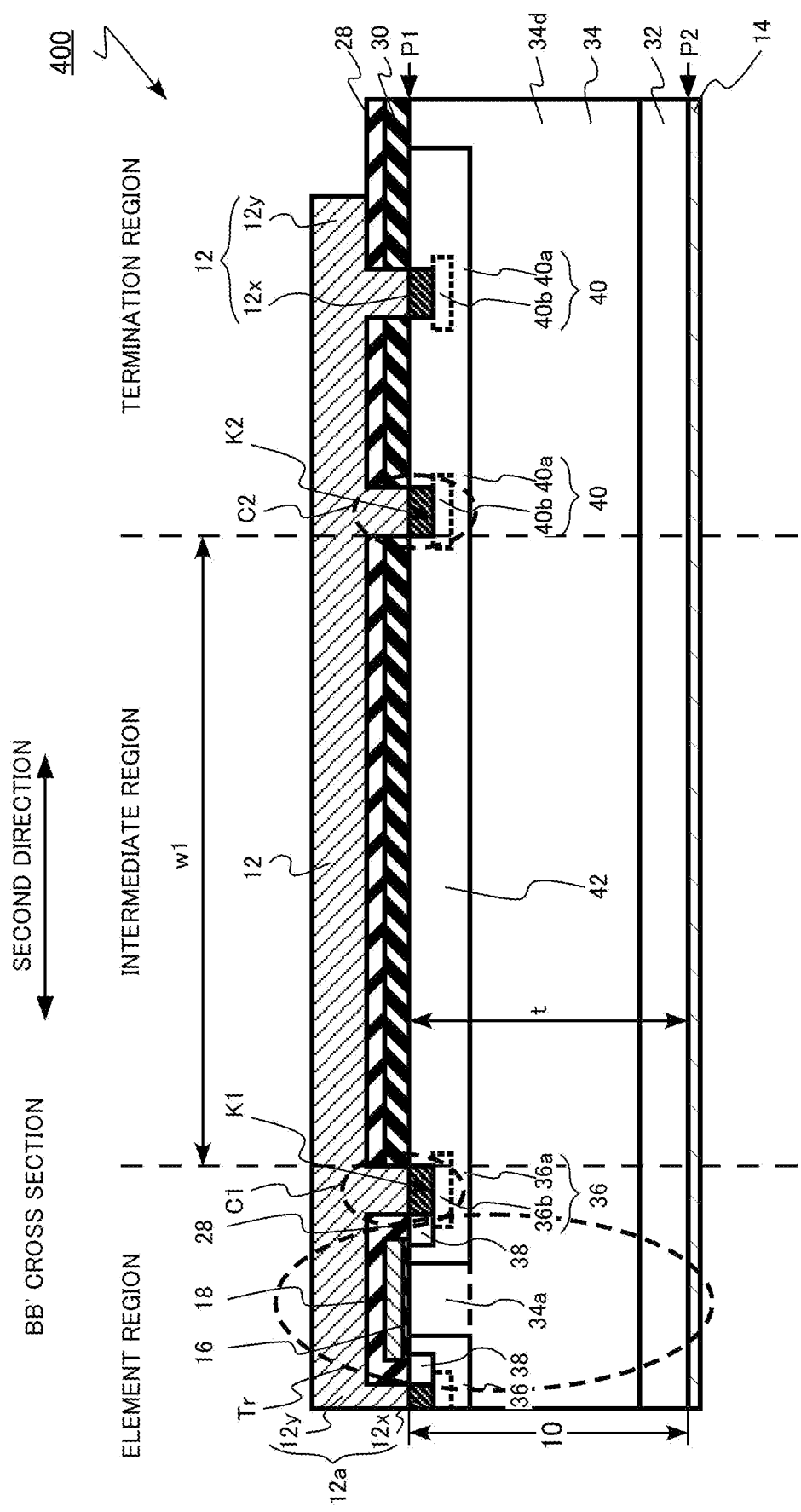
FIG. 17 is a schematic cross-sectional view of a semiconductor device of a fourth embodiment.

FIG. 17 is a schematic cross-sectional view of the semiconductor device of the fourth embodiment. FIG. 17 is a diagram corresponding to FIG. 14 of the third embodiment.

The semiconductor device of the fourth embodiment is a planar gate type vertical MOSFET 400 using silicon carbide. The MOSFET 400 of the fourth embodiment is, for example, a DIMOSFET in which a body region and a source region are formed by ion implantation. In addition, the semiconductor device of the fourth embodiment includes an SBD as a built-in diode.

As shown in FIG. 17, the termination region 102 of the MOSFET 400 does not include a second diode.

As described above, according to the fourth embodiment, as in the third embodiment, a MOSFET in which thermal breakdown in the termination region is suppressed and the surge current withstand capacity is improved is realized.

In the first to fourth embodiments, the case of 4H-SiC has been described as an example of the crystal structure of SiC. However, embodiments can also be applied to devices using SiC having other crystal structures, such as 6H-SiC and 3C-SiC. In addition, a face other than the (0001) face can also be applied as the surface of the silicon carbide layer 10.

In the first to fourth embodiments, the case where the first conductive type is n-type and the second conductive type is p-type has been described as an example. However, the first conductive type can be p-type and the second conductive type can be n-type.

In the first to fourth embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

In the first to fourth embodiments, the case where the gate electrode 18 in the element region 101 has a striped shape has been described as an example. However, for example, the gate electrode 18 may have a mesh-shaped structure.

While certain embodiments have been described, these embodiments have been presented by way of example only, and are not intended to the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fail within the scope and spirit of the inventions.

What is claimed is:

1. A semiconductor device, comprising:
an element region including a transistor, a first diode, and a first contact portion;
a termination region surrounding the element region and including a second contact portion; and
an intermediate region provided between the element region and the termination region and not including the transistor, the first diode, the first contact portion, and the second contact portion,
wherein the element region includes:
a first electrode;
a second electrode;
a gate electrode;
a silicon carbide layer provided between the first electrode and the second electrode, having a first face on a side of the first electrode and a second face on a side of the second electrode, and including:
a first silicon carbide region of a first conductive type having a first region and a second region, the first region being in contact with the first face and facing the gate electrode, and the second region being in contact with the first face and in contact with the first electrode;
a second silicon carbide region of a second conductive type prodded between the first silicon carbide region and the first face, the second silicon carbide region being adjacent to the first region, the second silicon carbide region facing the gate electrode, and the second silicon carbide region being in contact with the first electrode at a first interface; and
a third silicon carbide region of a first conductive type provided between the second silicon carbide region and the first face and electrically connected to the first electrode; and a gate insulating layer provided between the gate electrode and the second silicon carbide region and between the gate electrode and the first region, the termination region includes:

a first wiring layer electrically connected to the first electrode;

the second electrode; and the silicon carbide layer including the first silicon carbide region and a fourth silicon carbide region of a second conductive type, the fourth silicon carbide region provided between the first silicon carbide region and the first face, the fourth silicon carbide region being in contact with the first wiring layer at a second interface, the intermediate region includes the silicon carbide layer including the first silicon carbide region and a fifth silicon carbide region of a second conductive type, the fifth silicon carbide region provided between the first silicon carbide region and the first face, the transistor includes the gate electrode, the gate insulating layer, the first region, the second silicon carbide region, and the third silicon carbide region, the first diode includes the first electrode and the second region, the first contact portion includes the first interface, the second contact portion includes the second interface, and a width of the intermediate region in a direction from the element region to the termination region is equal to or more than twice a thickness of the silicon carbide layer.

2. The semiconductor device according to claim 1, wherein the intermediate region further includes a connection layer connecting the first electrode and the first wiring layer to each other, and the connection layer is not in contact with the fifth silicon carbide region.

3. The semiconductor device according to claim 2, wherein the gate electrode extends in a first direction parallel to the first face.

4. The semiconductor device according to claim 3, wherein the connection layer is provided in a second direction of the first electrode, and the second direction is parallel to the first face and perpendicular to the first direction.

5. The semiconductor device according to claim 4, wherein the first wiring layer has a first portion extending in the second direction, a second portion extending in the second direction, a third portion extending in the first direction, and a fourth portion extending in the first direction, the first electrode is interposed between the first portion and the second portion and between the third portion and the fourth portion, and the connection layer is provided between the first electrode and the fourth portion.

6. The semiconductor device according to claim 5, wherein the intermediate region further includes a gate electrode pad and a second wiring layer electrically connected to the gate electrode pad, the gate electrode is electrically connected to the gate electrode pad through the second wiring layer, and the second wiring layer has a first line extending in the second direction and provided between the first portion and the first electrode and a second line extending in the second direction and provided between the second portion and the first electrode.

7. The semiconductor device according to claim 6, wherein the first electrode, the first wiring layer, the connection layer, the gate electrode pad, and the second wiring layer contain a same material.

8. The semiconductor device according to claim 3, wherein a first width of the intermediate region in a second direction perpendicular to the first direction is larger than a second width of the intermediate region in the first direction.

9. The semiconductor device according to claim 1, wherein the termination region includes a second diode, the first silicon carbide region included in the termination region has a third region in contact with the first face and in contact with the first wiring layer, and the second diode includes the first wiring layer and the third region.

10. A semiconductor device, comprising:

an element region including a transistor, a first diode, and a first contact portion;

a termination region surrounding the element region and including a second contact portion; and an intermediate region provided between the element region and the termination region and not including the transistor, the first diode, the first contact portion, and the second contact portion, wherein the element region includes:

a first electrode;

a second electrode;

a gate electrode;

a silicon carbide layer provided between the first electrode and the second electrode, having a first face on a side of the first electrode and a second face on a side of the second electrode, and including:

a first silicon carbide region of a first conductive type having a first region and a second region, the first region being in contact with the first face and facing the gate electrode and the second region being in contact with the first face and in contact with the first electrode;

a second silicon carbide region of a second conductive type provided between the first silicon carbide region and the first face, the second silicon carbide region being adjacent to the first region, the second silicon carbide region facing the gate electrode, and the second silicon carbide region being in contact with the first electrode at a first interface; and a third silicon carbide region of a first conductive type provided between the second silicon carbide region and the first face and electrically connected to the first electrode; and a gate insulating layer provided between the gate electrode and the second silicon carbide region and between the gate electrode and the first region, the termination region includes:

the first electrode;

the second electrode; and the silicon carbide layer including the first silicon carbide region and a fourth silicon carbide region of a second conductive type, the fourth silicon carbide region provided between the first silicon carbide region and the first face, the fourth silicon carbide region being in contact with the first electrode at a second interface, the intermediate region includes:

the first electrode;

the second electrode; and the silicon carbide layer including the first silicon carbide region and a fifth silicon carbide region of a second conductive type, the fifth silicon carbide region provided between the first silicon carbide region and the first face, the transistor includes the gate electrode, the gate insulating layer, the first region, the second silicon carbide region, and the third silicon carbide region, the first diode includes the first electrode and the second region, the first contact portion includes the first interface, the second contact portion includes the second interface, and a width of the intermediate region in a direction from the element region to the termination region is equal to or more than twice a thickness of the silicon carbide layer.

11. The semiconductor device according to claim 10, wherein the termination region includes a second diode, the first silicon carbide region included in the termination region has a third region in contact with the first face and in contact with the first electrode, and the second diode includes the first electrode and the third region.

12. The semiconductor device according to claim 10, wherein the intermediate region further includes:

a gate electrode pad; and a gate wiring layer provided between the first electrode and the silicon carbide layer, the gate wiring layer electrically connected to the gate electrode pad and the gate electrode, and the gate wiring layer including a first gate line extending in a second direction perpendicular to a first direction parallel to the first face and a second gate line extending in the second direction, the gate electrode being interposed between the first gate line and the second gate line.

* * * * *